US012645968B1

(12) United States Patent
Sete et al.

(10) Patent No.: US 12,645,968 B1
(45) Date of Patent: Jun. 2, 2026

(54) TUNABLE QUBIT DEVICE IN A SUPERCONDUCTING QUANTUM PROCESSING CIRCUIT

(71) Applicant: Rigetti & Co, LLC, Berkeley, CA (US)

(72) Inventors: Eyob A. Sete, Walnut Creek, CA (US); Angela Q. Chen, Oakland, CA (US); Stefano Poletto, Orinda, CA (US); Shobhan Kulshreshtha, Berkeley, CA (US); Riccardo Manenti, Berkeley, CA (US)

(73) Assignee: Rigetti & Co, LLC, Berkeley, CA (US)

( * ) Notice: Subject to any disclaimer, the term of this patent is extended or adjusted under 35 U.S.C. 154(b) by 779 days.

(21) Appl. No.: 17/849,139

(22) Filed: Jun. 24, 2022

Related U.S. Application Data

(60) Provisional application No. 63/216,368, filed on Jun. 29, 2021.

(51) Int. Cl.
G06N 10/40 (2022.01)
H10N 60/12 (2023.01)
(52) U.S. Cl.
CPC ............. G06N 10/40 (2022.01); H10N 60/12 (2023.02)
(58) Field of Classification Search
CPC ........ G06N 10/00; G06N 10/60; G06N 10/70; G06N 10/80; G06N 10/40; H10N 60/12
USPC ......................................................... 716/100
See application file for complete search history.

(56) References Cited

U.S. PATENT DOCUMENTS

| | | | |
|---|---|---|---|
| 9,892,365 B2 | 2/2018 | Rigetti et al. | |
| 10,050,630 B2 | 8/2018 | Reagor et al. | |
| 10,056,908 B2 | 8/2018 | Rigetti et al. | |
| 10,068,181 B1 | 9/2018 | Rigetti et al. | |
| 10,483,980 B2 | 11/2019 | Sete et al. | |
| 2002/0183002 A1* | 12/2002 | Vail ....................... H01S 5/4025 | 455/10 |
| 2003/0224944 A1* | 12/2003 | Il'ichev .................. B82Y 10/00 | 505/170 |
| 2004/0077503 A1* | 4/2004 | Blais ...................... G06N 10/40 | 505/193 |

(Continued)

OTHER PUBLICATIONS

Frattini , et al., "Optimizing the nonlinearity and dissipation of a SNAIL Parametric Amplifier for dynamic range", arXiv:1806.06093v2, Dec. 20, 2018, 17 pgs.

(Continued)

*Primary Examiner* — Paul Dinh
(74) *Attorney, Agent, or Firm* — Henry Patent Law Firm PLLC

(57) ABSTRACT

In a general aspect, a superconducting quantum processing circuit includes a tunable qubit device. The tunable qubit device includes a circuit loop configured to receive, during operation of the tunable qubit device, a magnetic flux that controls a qubit frequency of the tunable qubit device. In some aspects, the circuit loop consists of: a single non-linear circuit element and one or more linear circuit elements. The single non-linear circuit element is a Josephson junction connected between a first circuit node and a second circuit node. The one or more linear circuit elements includes a linear inductor connected in parallel with the Josephson junction between the first circuit node and the second circuit node.

21 Claims, 8 Drawing Sheets

(56)                References Cited

U.S. PATENT DOCUMENTS

| | | | |
|---|---|---|---|
| 2012/0098594 A1* | 4/2012 | Zmuidzinas | H03F 7/02 |
| | | | 333/99 S |
| 2014/0375515 A1* | 12/2014 | Qiu | H01Q 5/378 |
| | | | 343/745 |
| 2016/0133375 A1* | 5/2016 | Li | H01F 17/0006 |
| | | | 336/200 |
| 2016/0292586 A1 | 10/2016 | Rigetti et al. | |
| 2017/0230050 A1 | 8/2017 | Rigetti et al. | |
| 2018/0054201 A1 | 2/2018 | Reagor et al. | |
| 2018/0247974 A1* | 8/2018 | Oliver | H10N 60/0241 |
| 2019/0007051 A1 | 1/2019 | Sete et al. | |
| 2020/0027502 A1* | 1/2020 | Berggren | G11C 11/44 |
| 2020/0320426 A1* | 10/2020 | Amin | G06N 10/40 |
| 2020/0411937 A1* | 12/2020 | Whittaker | G06N 10/00 |
| 2021/0281241 A1* | 9/2021 | Safavi-Naeini | H03H 9/24 |
| 2022/0005524 A1* | 1/2022 | Mihailovic | H10N 70/253 |
| 2022/0103172 A1* | 3/2022 | Mundhada | G06N 10/40 |
| 2022/0156620 A1* | 5/2022 | McDermott, III | G06N 10/40 |
| 2023/0010205 A1* | 1/2023 | Sank | G01R 33/0358 |
| 2024/0138268 A1* | 4/2024 | Enderud | H10N 69/00 |
| 2024/0305256 A1* | 9/2024 | Katz | H03F 19/00 |

OTHER PUBLICATIONS

Hill, Alex, "Gain deeper control of Rigetti quantum processors with Quil-T", Rigetti Computing, Dec. 2020, 2020, 10 pages.

* cited by examiner

300

400

600

TUNABLE QUBIT DEVICE IN A SUPERCONDUCTING QUANTUM PROCESSING CIRCUIT

CROSS-REFERENCE TO RELATED APPLICATIONS

This application claims priority to U.S. Provisional Patent Application No. 63/216,368, filed Jun. 29, 2021, entitled "Tunable Qubit Device in a Superconducting Quantum Processing Circuit." The above-referenced priority document is incorporated herein by reference in its entirety.

BACKGROUND

The following description relates to a tunable qubit device in a superconducting quantum processing unit.

Quantum computers can perform computational tasks by storing and processing information within quantum states of quantum systems. For example, qubits (i.e., quantum bits) can be stored in, and represented by, an effective two-level sub-manifold of a quantum coherent physical system. A variety of physical systems have been proposed for quantum computing applications. Examples include superconducting circuits, trapped ions, spin systems, and others.

DETAILED DESCRIPTION

Figure 1:
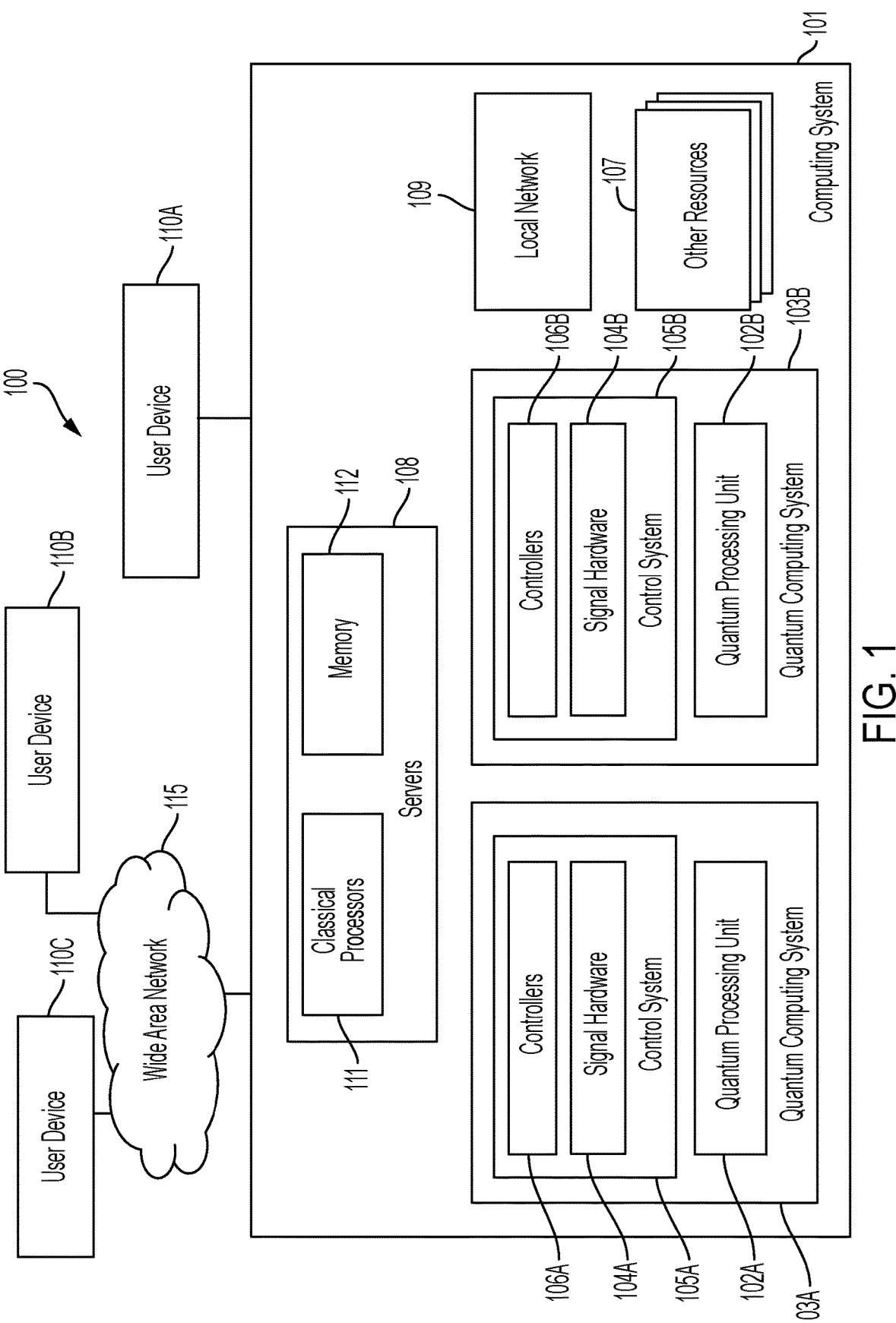
FIG. 1 is a block diagram of an example computing system.

In some aspects of what is described here, a superconducting quantum processing circuit includes a tunable qubit device. In some examples, the tunable qubit device includes a circuit loop consisting of a single non-linear circuit element and one or more linear circuit elements. In certain examples, the non-linear circuit element is a Josephson junction connected between a first circuit node and a second circuit node; and the linear circuit elements includes a linear inductor, which is connected in parallel with the Josephson junction between the first and second circuit nodes. The linear inductor can be implemented as a conductive stripline that has an inductance value that is proportional to a magnetic flux experienced by the linear inductor. In some instances, a conductive stripline includes a superconductive material and may be configured in a variety of shapes including a straight line, a meander line, a single turn, a spiral (e.g., circular, square, octagonal, or another shape) with more than one turn, or another shape. In certain examples, one or both of the circuit nodes is connected to a qubit electrode that is electrically floating (not directly connected to ground); for instance, the qubit electrode is not conductively connected to a ground plane or a grounded electrode. In certain examples, the circuit nodes are shunted by a large capacitance, for example, in a range of 60-150 fF. In some instances, the circuit nodes are shunted by a capacitance of 100 fF. Suh shunting capacitance may be caused by the junction itself and/or caused by the capacitive coupling between the qubit electrode and the ground plane.

In some implementations, the systems and techniques described here can provide technical advantages and improvements. For instance, the systems and techniques described here can improve production yield of tunable qubit devices by reducing the variations in the fabrication process and may also improve performance of tunable qubit devices. In some examples, the methods and systems disclosed here can reduce the overall range of variation in the junction inductance in qubit devices, and reduce the overall range of variation in the qubit frequencies of tunable qubit devices. In some cases, sensitivity of the qubit frequency to flux noise and the variations in junction inductance is also reduced. For another example, the systems and techniques described here may result in a large shunt capacitance and positive anharmonicity at the operating point of a tunable qubit device, which can reduce charge noise and leakage to upper energy levels when performing quantum logic operations.

In some cases, the methods and systems disclosed here can be utilized in a scalable fault-tolerant quantum computer with high fidelity and long coherence time. In some cases, the methods and systems disclosed here allow the operation of quantum logic gates with reliable and high-precision frequency targeting, which enables fast operation of quantum logic gates by bringing the qubit into resonance with a neighboring qubit to activate the gate and quickly bring it back to the parking (idle) frequency. In some cases, a combination of these and potentially other advantages and improvements may be obtained.

FIG. 1 is a block diagram of an example computing environment 100. The example computing environment 100 shown in FIG. 1 includes a computing system 101 and user devices 110A, 110B, 110C. A computing environment may include additional or different features, and the components of a computing environment may operate as described with respect to FIG. 1 or in another manner.

The example computing system 101 includes classical and quantum computing resources and exposes their functionality to the user devices 110A, 110B, 110C (referred to collectively as "user devices 110"). The computing system 101 shown in FIG. 1 includes one or more servers 108, quantum computing systems 103A, 103B, a local network 109, and other resources 107. The computing system 101 may also include one or more user devices (e.g., the user device 110A) as well as other features and components. A computing system may include additional or different features, and the components of a computing system may operate as described with respect to FIG. 1 or in another manner.

The example computing system 101 can provide services to the user devices 110, for example, as a cloud-based or remote-accessed computer system, as a distributed computing resource, as a supercomputer or another type of high-performance computing resource, or in another manner. The computing system 101 or the user devices 110 may also have access to one or more other quantum computing systems (e.g., quantum computing resources that are accessible through the wide area network 115, the local network 109, or otherwise).

The user devices 110 shown in FIG. 1 may include one or more classical processors, memory, user interfaces, communication interfaces, and other components. For instance, the user devices 110 may be implemented as laptop computers, desktop computers, smartphones, tablets, or other types of computer devices. In the example shown in FIG. 1, to access computing resources of the computing system 101, the user devices 110 send information (e.g., programs, instructions, commands, requests, input data, etc.) to the servers 108; and in response, the user devices 110 receive information (e.g., application data, output data, prompts, alerts, notifications, results, etc.) from the servers 108. The user devices 110 may access services of the computing system 101 in another manner, and the computing system 101 may expose computing resources in another manner.

In the example shown in FIG. 1, the local user device 110A operates in a local environment with the servers 108 and other elements of the computing system 101. For instance, the user device 110A may be co-located with (e.g., located within 0.5 to 1 km of) the servers 108 and possibly other elements of the computing system 101. As shown in FIG. 1, the user device 110A communicates with the servers 108 through a local data connection.

The local data connection in FIG. 1 is provided by the local network 109. For example, some or all of the servers 108, the user device 110A, the quantum computing systems 103A, 103B, and the other resources 107 may communicate with each other through the local network 109. In some implementations, the local network 109 operates as a communication channel that provides one or more low-latency communication pathways from the server 108 to the quantum computer systems 103A, 103B (or to one or more of the elements of the quantum computer systems 103A, 103B). The local network 109 can be implemented, for instance, as a wired or wireless Local Area Network, an Ethernet connection, or another type of wired or wireless connection. The local network 109 may include one or more wired or wireless routers, wireless access points (WAPs), wireless mesh nodes, switches, high-speed cables, or a combination of these and other types of local network hardware elements. In some cases, the local network 109 includes a software-defined network that provides communication among virtual resources, for example, among an array of virtual machines operating on the server 108 and possibly elsewhere.

In the example shown in FIG. 1, the remote user devices 110B, 110C operate remote from the servers 108 and other elements of the computing system 101. For instance, the user devices 110B, 110C may be located at a remote distance (e.g., more than 1 km, 10 km, 100 km, 1,000 km, 10,000 km, or farther) from the servers 108 and possibly other elements of the computing system 101. As shown in FIG. 1, each of the user devices 110B, 110C communicates with the servers 108 through a remote data connection.

The remote data connection in FIG. 1 is provided by a wide area network 115, which may include, for example, the Internet or another type of wide area communication network. In some cases, remote user devices use another type of remote data connection (e.g., satellite-based connections, a cellular network, a virtual private network, etc.) to access the servers 108. The wide area network 115 may include one or more internet servers, firewalls, service hubs, base stations, or a combination of these and other types of remote networking elements. Generally, the computing environment 100 can be accessible to any number of remote user devices.

The example servers 108 shown in FIG. 1 can manage interaction with the user devices 110 and utilization of the quantum and classical computing resources in the computing system 101. For example, based on information from the user devices 110, the servers 108 may delegate computational tasks to the quantum computing systems 103A, 103B and the other resources 107; the servers 108 can then send information to the user devices 110 based on output data from the computational tasks performed by the quantum computing systems 103A, 103B, and the other resources 107.

As shown in FIG. 1, the servers 108 are classical computing resources that include classical processors 111 and memory 112. The servers 108 may also include one or more communication interfaces that allow the servers to communicate via the local network 109, the wide area network 115 and possibly other channels. In some implementations, the servers 108 may include a host server, an application server, a virtual server or a combination of these and other types of servers. The servers 108 may include additional or different features, and may operate as described with respect to FIG. 1 or in another manner.

The classical processors 111 can include various kinds of apparatus, devices, and machines for processing data, including, by way of example, a microprocessor, a central processing unit (CPU), a graphics processing unit (GPU), an FPGA (field programmable gate array), an ASIC (application specific integrated circuit), or combinations of these. The memory 112 can include, for example, a random-access memory (RAM), a storage device (e.g., a writable read-only memory (ROM) or others), a hard disk, or another type of storage medium. The memory 112 can include various forms of volatile or non-volatile memory, media, and memory devices, etc.

Each of the example quantum computing systems 103A, 103B operates as a quantum computing resource in the computing system 101. The other resources 107 may include additional quantum computing resources (e.g., quantum computing systems, quantum simulators, or both) as well as classical (non-quantum) computing resources such as, for example, digital microprocessors, specialized co-processor units (e.g., graphics processing units (GPUs), cryptographic co-processors, etc.), special purpose logic circuitry (e.g., field programmable gate arrays (FPGAs), application-specific integrated circuits (ASICs), etc.), systems-on-chips (SoCs), etc., or combinations of these and other types of computing modules.

In some implementations, the servers 108 generate programs, identify appropriate computing resources (e.g., a QPU or QVM) in the computing system 101 to execute the programs, and send the programs to the identified resources for execution. For example, the servers 108 may send programs to the quantum computing system 103A, the quantum computing system 103B, or any of the other resources 107. The programs may include classical programs, quantum programs, hybrid classical/quantum programs, and may include any type of function, code, data, instruction set, etc.

In some instances, programs can be formatted as source code that can be rendered in human-readable form (e.g., as text) and can be compiled, for example, by a compiler running on the servers 108, on the quantum computing systems 103, or elsewhere. In some instances, programs can be formatted as compiled code, such as, for example, binary code (e.g., machine-level instructions) that can be executed directly by a computing resource. Each program may include instructions corresponding to computational tasks that, when performed by an appropriate computing resource, generate output data based on input data. For example, a program can include instructions formatted for a quantum computer system, a simulator, a digital microprocessor, co-processor or other classical data processing apparatus, or another type of computing resource.

In some cases, a program may be expressed in a hardware-independent format. For example, quantum machine instructions may be provided in a quantum instruction language such as Quil, described in the publication "A Practical Quantum Instruction Set Architecture," arXiv: 1608.03355v2, dated Feb. 17, 2017, or another quantum instruction language. For instance, the quantum machine instructions may be written in a format that can be executed by a broad range of quantum processing units or simulators. In some cases, a program may be expressed in high-level terms of quantum logic gates or quantum algorithms, in lower-level terms of fundamental qubit rotations and controlled rotations, or in another form. In some cases, a program may be expressed in terms of control signals (e.g., pulse sequences, delays, etc.) and parameters for the control signals (e.g., frequencies, phases, durations, channels, etc.). In some cases, a program may be expressed in another form or format. In some cases, a program may utilize Quil-T, described in the 2020 publication entitled "Gain deeper control of Rigetti quantum processing units with Quil-T."

In some implementations, the servers 108 include one or more compilers that convert programs between formats. For example, the servers 108 may include a compiler that converts hardware-independent instructions to binary programs for execution by the quantum computing systems 103A, 103B. In some cases, a compiler can compile a program to a format that targets a specific quantum resource in the computer system 101. For example, a compiler may generate a different binary program (e.g., from the same source code) depending on whether the program is to be executed by the quantum computing system 103A or the quantum computing system 103B.

In some cases, a compiler generates a partial binary program that can be updated, for example, based on specific parameters. For instance, if a quantum program is to be executed iteratively on a quantum computing system with varying parameters on each iteration, the compiler may generate the binary program in a format that can be updated with specific parameter values at runtime (e.g., based on feedback from a prior iteration, or otherwise); the parametric update can be performed without further compilation. In some cases, a compiler generates a full binary program that does not need to be updated or otherwise modified for execution.

In some implementations, the servers 108 generate a schedule for executing programs, allocate computing resources in the computing system 101 according to the schedule, and delegate the programs to the allocated computing resources. The servers 108 can receive, from each computing resource, output data from the execution of each program. Based on the output data, the servers 108 may generate additional programs that are then added to the schedule, output data that is provided back to a user device 110, or perform another type of action.

In some implementations, all or part of the computing environment operates as a cloud-based quantum computing (QC) environment, and the servers 108 operate as a host system for the cloud-based QC environment. The cloud-based QC environment may include software elements that operate on both the user devices 110 and the computer system 101 and interact with each other over the wide area network 115. For example, the cloud-based QC environment may provide a remote user interface, for example, through a browser or another type of application on the user devices 110. The remote user interface may include, for example, a graphical user interface or another type of user interface that obtains input provided by a user of the cloud-based QC environment. In some cases the remote user interface includes, or has access to, one or more application programming interfaces (APIs), command line interfaces, graphical user interfaces, or other elements that expose the services of the computer system 101 to the user devices 110.

In some cases, the cloud-based QC environment may be deployed in a "serverless" computing architecture. For instance, the cloud-based QC environment may provide on-demand access to a shared pool of configurable computing resources (e.g., networks, servers, storage, applications, services, quantum computing resources, classical computing resources, etc.) that can be provisioned for requests from user devices 110. Moreover, the cloud-based computing systems 101 may include or utilize other types of computing resources, such as, for example, edge computing, fog computing, etc.

In an example implementation of a cloud-based QC environment, the servers 108 may operate as a cloud provider that dynamically manages the allocation and provisioning of physical computing resources (e.g., GPUs, CPUs, QPUs, etc.). Accordingly, the servers 108 may provide services by defining virtualized resources for each user account. For instance, the virtualized resources may be formatted as virtual machine images, virtual machines, containers, or virtualized resources that can be provisioned for a user account and configured by a user. In some cases, servers 108 include a container management and execution system that is implemented, for example, using KUBERNETES® or another software platform for container management. In some cases, the cloud-based QC environment is implemented using a resource such as, for example, OPENSTACK®. OPENSTACK® is an example of a software platform for cloud-based computing, which can be used to provide virtual servers and other virtual computing resources for users.

In some cases, the server 108 stores quantum machine images (QMI) for each user account. A quantum machine image may operate as a virtual computing resource for users of the cloud-based QC environment. For example, a QMI can provide a virtualized development and execution environment to develop and run programs (e.g., quantum programs or hybrid classical/quantum programs). When a QMI operates on the server 108, the QMI may engage either of the quantum processor units 102A, 102B, and interact with a remote user device (110B or 110C) to provide a user programming environment. The QMI may operate in close physical proximity to and have a low-latency communication link with the quantum computing systems 103A, 103B. In some implementations, remote user devices connect with QMIs operating on the servers 108 through secure shell (SSH) or other protocols over the wide area network 115.

In some implementations, all or part of the computing system 101 operates as a hybrid computing environment. For example, quantum programs can be formatted as hybrid classical/quantum programs that include instructions for execution by one or more quantum computing resources and instructions for execution by one or more classical resources. The servers 108 can allocate quantum and classical computing resources in the hybrid computing environment, and delegate programs to the allocated computing resources for execution. The quantum computing resources in the hybrid environment may include, for example, one or more quantum processing units (QPUs), one or more quantum virtual machines (QVMs), one or more quantum simulators, or possibly other types of quantum resources. The classical computing resources in the hybrid environment may include, for example, one or more digital microprocessors, one or more specialized co-processor units (e.g., graphics processing units (GPUs), cryptographic co-processors, etc.), special purpose logic circuitry (e.g., field programmable gate arrays (FPGAs), application-specific integrated circuits (ASICs), etc.), systems-on-chips (SoCs), or other types of computing modules.

In some cases, the servers 108 can select the type of computing resource (e.g., quantum or classical) to execute an individual program, or part of a program, in the computing system 101. For example, the servers 108 may select a particular quantum processing unit (QPU) or other computing resource based on availability of the resource, speed of the resource, information or state capacity of the resource, a performance metric (e.g., process fidelity) of the resource, or based on a combination of these and other factors. In some cases, the servers 108 can perform load balancing, resource testing and calibration, and other types of operations to improve or optimize computing performance.

Each of the example quantum computing systems 103A, 103B shown in FIG. 1 can perform quantum computational tasks by executing quantum machine instructions (e.g., a binary program compiled for the quantum computing system). In some implementations, a quantum computing system can perform quantum computation by storing and manipulating information within quantum states of a composite quantum system. For example, qubits (i.e., quantum bits) can be stored in and represented by an effective two-level sub-manifold of a quantum coherent physical system. In some instances, quantum logic can be executed in a manner that allows large-scale entanglement within the quantum system. Control signals can manipulate the quantum states of individual qubits and the joint states of multiple qubits. In some instances, information can be read out from the composite quantum system by measuring the quantum states of the qubits. In some implementations, the quantum states of the qubits are read out by measuring the transmitted or reflected signal from auxiliary quantum devices that are coupled to individual qubits.

In some implementations, a quantum computing system can operate using gate-based models for quantum computing. For example, the qubits can be initialized in an initial state, and a quantum logic circuit comprised of a series of quantum logic gates can be applied to transform the qubits and extract measurements representing the output of the quantum computation. Individual qubits may be controlled by single-qubit quantum logic gates, and pairs of qubits may be controlled by two-qubit quantum logic gates (e.g., entangling gates that are capable of generating entanglement between the pair of qubits). In some implementations, a quantum computing system can operate using adiabatic or annealing models for quantum computing. For instance, the qubits can be initialized in an initial state, and the controlling Hamiltonian can be transformed adiabatically by adjusting control parameters to another state that can be measured to obtain an output of the quantum computation.

In some models, fault-tolerance can be achieved by applying a set of high-fidelity control and measurement operations to the qubits. For example, quantum error correcting schemes can be deployed to achieve fault-tolerant quantum computation. Other computational regimes may be used; for example, quantum computing systems may operate in non-fault-tolerant regimes. In some implementations, a quantum computing system is constructed and operated according to a scalable quantum computing architecture. For example, in some cases, the architecture can be scaled to a large number of qubits to achieve large-scale general purpose coherent quantum computing. Other architectures may be used; for example, quantum computing systems may operate in small-scale or non-scalable architectures.

The example quantum computing system 103A shown in FIG. 1 includes a quantum processing unit 102A and a control system 105A, which controls the operation of the quantum processing unit 102A. Similarly, the example quantum computing system 103B includes a quantum processing unit 102B and a control system 105B, which controls the operation of a quantum processing unit 102B. A quantum computing system may include additional or different features, and the components of a quantum computing system may operate as described with respect to FIG. 1 or in another manner.

In some instances, all or part of the quantum processing unit 102A functions as a quantum processor, a quantum memory, or another type of subsystem. In some examples, the quantum processing unit 102A includes a quantum circuit system. The quantum circuit system may include qubit devices, readout devices, and possibly other devices that are used to store and process quantum information. In some cases, the quantum processing unit 102A includes a superconducting circuit, and the superconducting circuit includes two qubit devices operatively coupled to each other by a coupler device. In certain examples, the qubit devices and the coupler device are implemented as superconducting quantum circuit devices that include Josephson junctions, for example, in Superconducting QUantum Interference Device (SQUID) loops or other arrangements, and are controlled by radio-frequency signals, microwave signals, and bias signals delivered to the quantum processing unit 102A.

In some implementations, a quantum processing unit 102A includes a superconducting quantum processing circuit which includes tunable qubit devices. In some examples, each tunable qubit device includes a circuit loop with a single non-linear circuit element and one or more linear circuit elements. The single non-linear circuit element can be a Josephson junction connected between a first circuit node and a second circuit node; and the one or more linear circuit elements can be a linear inductor, which is connected in parallel with the Josephson junction between the first and second circuit node. The linear inductor is galvanically connected to the Josephson junction through electrical connections, for example, conductive vias, metallization lines, and other linear circuit elements to form the circuit loop. The circuit loop is configured to receive, during the operation of the tunable qubit device, a magnetic flux, for example from a flux bias device in a flux bias control line, which can tune a qubit frequency of the tunable qubit device.

In some examples, tunable qubit devices in the quantum processing unit 102A each include a single linear inductor implemented as a conductive stripline that has an inductance value proportional to a magnetic flux value. The magnetic flux value can be determined (e.g., at least partially) by the magnetic flux that is applied by the flux bias device; magnetic flux from other sources (e.g., a background magnetic flux) may also contribute to the magnetic flux value in certain cases. In some instances, the conductive stripline includes a superconducting material and may be configured in a variety of shapes including a straight line, a meander line, a single turn, a spiral (e.g., circular, square, octagonal, or another shape) with more than one turn, or another shape. One or more circuit nodes of the tunable qubit device can be connected to a qubit electrode that is electrically floating (not directly connected to ground); for instance, the qubit electrode is not conductively connected to a ground plane or a grounded electrode. In some cases, the circuit nodes are shunted by a large capacitance caused by the capacitive coupling, for example, between the qubit electrode and the ground plane. Tunable qubit devices in the superconducting quantum logic circuit of the quantum processing unit 102A may be implemented according to the example superconducting quantum processing circuits 300, 500, 700, and 800 as shown in FIGS. 3, 5, 7, 8, or in another manner.

During operation, flux bias control signals can be provided to control the magnetic flux applied to the circuit loops of the respective tunable qubit devices. In some cases, the qubit frequency of a tunable qubit device can be tuned to a first frequency (e.g., minimum frequency) with the magnetic flux at the parking value. The flux bias control signal can tune the tunable qubit device by changing the magnetic flux from the parking value to a gate-activating value, when a quantum logic gate is performed. When the quantum logic gates are completed, the flux bias control signal can tune the frequency of the tunable qubit device to a second value (e.g., a maximum value) by changing the magnetic flux from the gate-activating value to the parking value.

The quantum processing unit 102A may include, or may be deployed within, a controlled environment. The controlled environment can be provided, for example, by shielding equipment, cryogenic equipment, and other types of environmental control systems. In some examples, the components in the quantum processing unit 102A operate in a cryogenic temperature regime and are subject to very low electromagnetic and thermal noise. For example, magnetic shielding can be used to shield the system components from stray magnetic fields, optical shielding can be used to shield the system components from optical noise, thermal shielding and cryogenic equipment can be used to maintain the system components at controlled temperature, etc.

In some implementations, the example quantum processing unit 102A can process quantum information by applying control signals to the qubits in the quantum processing unit 102A. The control signals can be configured to encode information in the qubits, to process the information by performing quantum logic gates or other types of operations, or to extract information from the qubits. In some examples, the operations can be expressed as single-qubit quantum logic gates, two-qubit quantum logic gates, or other types of quantum logic gates that operate on one or more qubits. A quantum logic circuit, which includes a sequence of quantum logic operations, can be applied to the qubits to perform a quantum algorithm. The quantum algorithm may correspond to a computational task, a hardware test, a quantum error correction procedure, a quantum state distillation procedure, or a combination of these and other types of operations.

The example control system 105A includes controllers 106A and signal hardware 104A. Similarly, control system 105B includes controllers 106B and signal hardware 104B. All or part of the control systems 105A, 105B can operate in a room-temperature environment or another type of environment, which may be located near the respective quantum processing units 102A, 102B. In some cases, the control systems 105A, 105B include classical computers, signaling equipment (microwave, radio, optical, bias, etc.), electronic systems, vacuum control systems, refrigerant control systems, or other types of control systems that support operation of the quantum processing units 102A, 102B.

The control systems 105A, 105B may be implemented as distinct systems that operate independent of each other. In some cases, the control systems 105A, 105B may include one or more shared elements; for example, the control systems 105A, 105B may operate as a single control system that operates both quantum processing units 102A, 102B. Moreover, a single quantum computer system may include multiple quantum processing units, which may operate in the same controlled (e.g., cryogenic) environment or in separate environments.

The example signal hardware 104A includes components that communicate with the quantum processing unit 102A. The signal hardware 104A may include, for example, waveform generators, amplifiers, digitizers, high-frequency sources, DC sources, AC sources, etc. The signal hardware may include additional or different features and components. In the example shown, components of the signal hardware 104A are adapted to interact with the quantum processing unit 102A. For example, the signal hardware 104A can be configured to operate in a particular frequency range, configured to generate and process signals in a particular format, or the hardware may be adapted in another manner.

In some instances, one or more components of the signal hardware 104A generate control signals, for example, based on control information from the controllers 106A. The control signals can be delivered to the quantum processing unit 102A during operation of the quantum computing system 103A. For instance, the signal hardware 104A may generate signals to implement quantum logic operations, readout operations, or other types of operations. As an example, the signal hardware 104A may include arbitrary waveform generators (AWGs) that generate electromagnetic waveforms (e.g., microwave or radio-frequency) or laser systems that generate optical waveforms. The waveforms or other types of signals generated by the signal hardware 104A can be delivered to devices in the quantum processing unit 102A to operate qubit devices, readout devices, bias devices, coupler devices, or other types of components in the quantum processing unit 102A.

In some instances, the signal hardware 104A receives and processes signals from the quantum processing unit 102A. The received signals can be generated by the execution of a quantum program on the quantum computing system 103A. For instance, the signal hardware 104A may receive signals from the devices in the quantum processing unit 102A in response to readout or other operations performed by the quantum processing unit 102A. Signals received from the quantum processing unit 102A can be mixed, digitized, filtered, or otherwise processed by the signal hardware 104A to extract information, and the information extracted can be provided to the controllers 106A or handled in another manner. In some examples, the signal hardware 104A may include a digitizer that digitizes electromagnetic waveforms (e.g., microwave or radio-frequency) or optical signals, and a digitized waveform can be delivered to the controllers 106A or to other signal hardware components. In some instances, the controllers 106A process the information from the signal hardware 104A and provide feedback to the signal hardware 104A; based on the feedback, the signal hardware 104A can in turn generate new control signals that are delivered to the quantum processing unit 102A.

In some implementations, the signal hardware 104A includes signal delivery hardware that interfaces with the quantum processing unit 102A. For example, the signal hardware 104A may include filters, attenuators, directional couplers, multiplexers, diplexers, bias components, signal channels, isolators, amplifiers, power dividers, and other types of components. In some instances, the signal delivery hardware performs preprocessing, signal conditioning, or other operations to the control signals to be delivered to the quantum processing unit 102A. In some instances, signal delivery hardware performs preprocessing, signal conditioning, or other operations on readout signals received from the quantum processing unit 102A.

The example controllers 106A communicate with the signal hardware 104A to control operation of the quantum computing system 103A. The controllers 106A may include classical computing hardware that directly interface with components of the signal hardware 104A. The example controllers 106A may include classical processors, memory, clocks, digital circuitry, analog circuitry, and other types of systems or subsystems. The classical processors may include one or more single- or multi-core microprocessors, digital electronic controllers, special purpose logic circuitry, e.g., an FPGA (field programmable gate array) or an ASIC (application specific integrated circuit), or other types of data processing apparatus. The memory may include any type of volatile or non-volatile memory or another type of computer storage medium. The controllers 106A may also include one or more communication interfaces that allow the controllers 106A to communicate via the local network 109 and possibly other channels. The controllers 106A may include additional or different features and components.

In some implementations, the controllers 106A include memory or other components that store quantum state information, for example, based on qubit readout operations performed by the quantum computing system 103A. For instance, the states of one or more qubits in the quantum processing unit 102A can be measured by qubit readout operations, and the measured state information can be stored in a cache or other type of memory system in one or more of the controllers 106A. In some cases, the measured state information is subsequently used in the execution of a quantum program, a quantum error correction procedure, a quantum processing unit (QPU) calibration or testing procedure, or another type of quantum process.

In some implementations, the controllers 106A include memory or other components that store a quantum program containing quantum machine instructions for execution by the quantum computing system 103A. In some instances, the controllers 106A can interpret the quantum machine instructions and perform hardware-specific control operations according to the quantum machine instructions. For example, the controllers 106A may cause the signal hardware 104A to generate control signals that are delivered to the quantum processing unit 102A to execute the quantum machine instructions.

In some instances, the controllers 106A extract qubit state information from qubit readout signals, for example, to identify the quantum states of qubits in the quantum processing unit 102A or for other purposes. For example, the controllers may receive the qubit readout signals (e.g., in the form of analog waveforms) from the signal hardware 104A, digitize the qubit readout signals, and extract qubit state information from the digitized signals. In some cases, the controllers 106A compute measurement statistics based on qubit state information from multiple shots of a quantum program. For example, each shot may produce a bitstring representing qubit state measurements for a single execution of the quantum program, and a collection of bitstrings from multiple shots may be analyzed to compute quantum state probabilities.

In some implementations, the controllers 106A include one or more clocks that control the timing of operations. For example, operations performed by the controllers 106A may be scheduled for execution over a series of clock cycles, and clock signals from one or more clocks can be used to control the relative timing of each operation or groups of operations. In some implementations, the controllers 106A may include classical computer resources that perform some or all of the operations of the servers 108 described above. For example, the controllers 106A may operate a compiler to generate binary programs (e.g., full or partial binary programs) from source code; the controllers 106A may include an optimizer that performs classical computational tasks of a hybrid classical/quantum program; the controllers 106A may update binary programs (e.g., at runtime) to include new parameters based on an output of the optimizer, etc.

The other quantum computer system 103B and its components (e.g., the quantum processing unit 102B, the signal hardware 104B, and controllers 106B) can be implemented as described above with respect to the quantum computer system 103A; in some cases, the quantum computer system 103B and its components may be implemented or may operate in another manner.

In some implementations, the quantum computer systems 103A, 103B are disparate systems that provide distinct modalities of quantum computation. For example, the computer system 101 may include both an adiabatic quantum computer system and a gate-based quantum computer system. As another example, the computer system 101 may include a superconducting circuit-based quantum computer system and an ion trap-based quantum computer system. In such cases, the computer system 101 may utilize each quantum computing system according to the type of quantum program that is being executed, according to availability or capacity, or based on other considerations.

Figure 2:
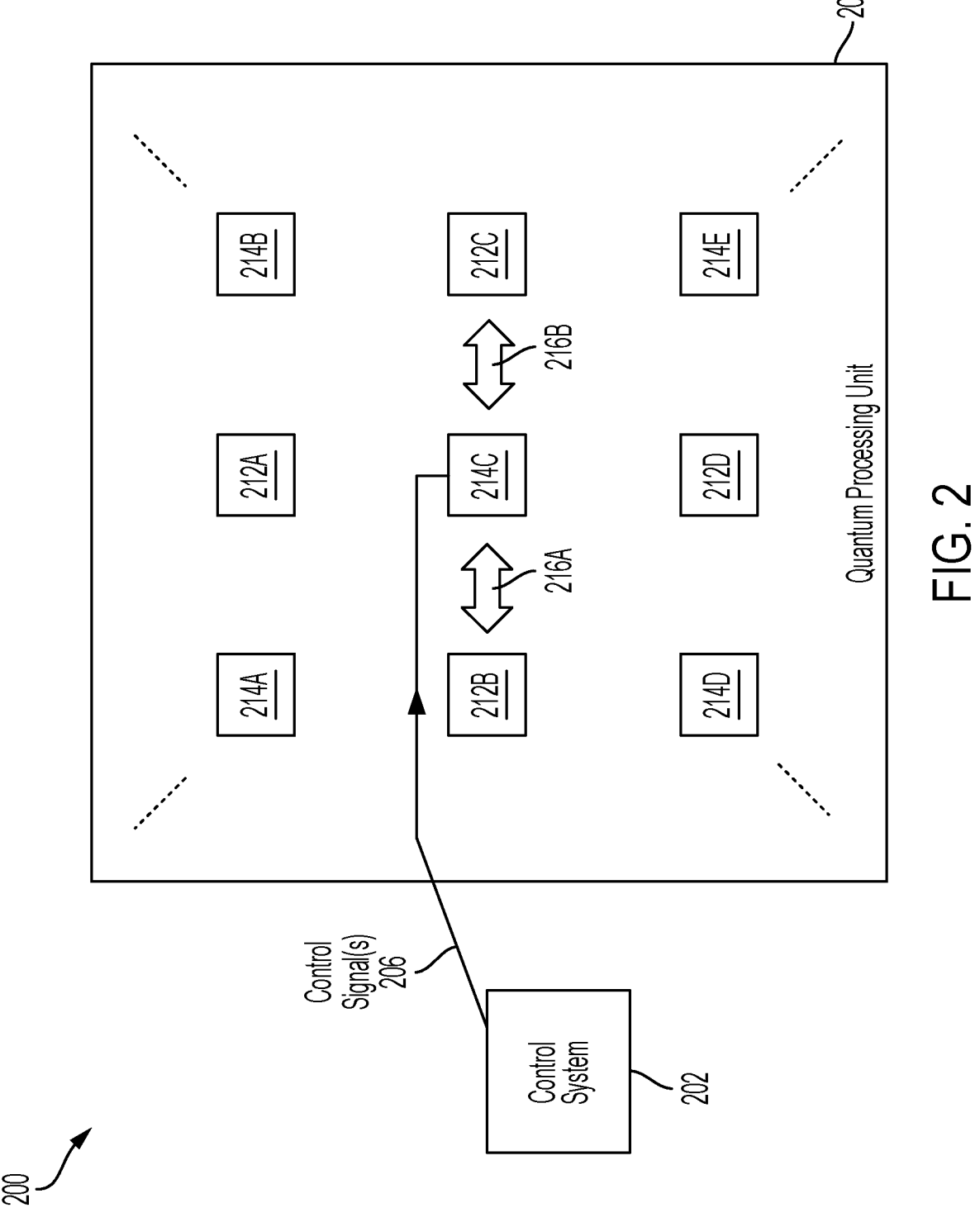
FIG. 2 is a block diagram showing devices and interactions in an example quantum computing system.

FIG. 2 is a block diagram showing devices and interactions in an example quantum computing system 200. The example quantum computing system 200 includes a control system 202 and a quantum processing unit 204. The example quantum processing unit 204 includes a device array, which includes quantum circuit devices arranged in a two-dimensional or three-dimensional lattice structure. Nine of the quantum circuit devices in the device array are shown in FIG. 2. In the example shown in FIG. 2, the quantum circuit devices include four fixed-frequency qubit devices 212, e.g., 212A, 212B, 212C, 212D and five tunable qubit devices 214, e.g., 214A, 214B, 214C, 214D, 214E. Another arrangement of quantum circuit devices can be used. For instance, all the quantum circuit devices may be implemented as tunable qubit devices, or certain quantum circuit devices may operate as coupler devices. The quantum computing system 200 may include additional or different features, and the components may be arranged in another manner.

In the example shown in FIG. 2, the quantum circuit devices are arranged in a rectilinear (e.g., rectangular, or square) array that extends in two spatial dimensions (e.g., in the plane of the page). In some implementations, the devices can be arranged in another type of ordered array. In some instances, the rectilinear array also extends in a third spatial dimension (e.g., in/out of the page), for example, to form a cubic array or another type of three-dimensional array. The quantum processing unit 204 may include additional devices, including additional qubit devices, readout resonators, or other quantum circuit devices.

In some implementations, the control system 202 interfaces with the quantum processing unit 204 through a signal delivery system that includes connector hardware elements. For example, the connector hardware elements of the control system 202 can include signal lines, signal processing hardware, filters, feedthrough devices (e.g., light-tight feedthroughs, etc.), and other types of components. In some implementations, the control system connector hardware can span multiple different temperature and noise regimes. For example, the connector hardware elements can include a series of temperature stages operating at different temperatures, e.g., 60 Kelvin (K), 3 K, 800 milli Kelvin (mK), 150 mK, that decrease between a higher temperature regime of the example control system 202 and a lower temperature regime of the example quantum processing unit 204.

In some implementations, the example quantum processing unit 204, and all or part of the signal delivery system and connector hardware elements, can be maintained in a controlled cryogenic environment. The environment can be provided, for example, by shielding equipment, cryogenic equipment, and other types of environmental control systems. In some examples, the components in the quantum processing unit 204 operate in a cryogenic temperature regime and are subject to very low electromagnetic and thermal noise. For example, magnetic shielding can be used to shield the system components from stray magnetic fields, optical shielding can be used to shield the system components from optical noise, and thermal shielding and cryogenic equipment can be used to maintain the system components at controlled temperatures, etc.

In certain instances, the example control system 202 shown in FIG. 2 may include, for example, a signal generator system, a program interface, a signal processing system, and possibly other components. In some instances, components of the control system 202 can operate in a room temperature regime, an intermediate temperature regime, or both. For example, the control system 202 can be configured to operate at much higher temperatures and be subject to much higher levels of noise than are present in the environment of the quantum processing unit 204.

In the example quantum processing unit 204 shown in FIG. 2, the qubit devices can be encoded with a single bit of quantum information. Typically, each of the qubit devices has two eigenstates that are used as computational basis states (e.g., $|0\rangle$ and $|1\rangle$ ), and each qubit device can transition between its computational basis states or exist in an arbitrary superposition of its computational basis states. In some examples, the two lowest energy levels (e.g., the ground state and first excited state) of each qubit device 212 are defined as a qubit and used as computational basis states for quantum computation. In some examples, higher energy levels (e.g., a second excited state or a third excited state) can be used to define a qubit, a qutrit, or a multi-level quantum computational device in some instances.

In some implementations, the qubit devices are housed between neighboring pairs of the coupler devices in a device array within the quantum processing unit 204. Quantum states (e.g., qubits) of respective qubit devices can be manipulated by control signals, or read by readout signals, generated by the control system 202. The qubit devices can be controlled individually, for example, by delivering control signals to the respective qubit devices. In some cases, readout devices can detect the states of the qubit devices, for example, by interacting directly with the respective qubit devices.

In the example shown in FIG. 2, the energy difference E between any two adjacent energy levels in a qubit device can be represented as a qubit frequency $\omega$ of the qubit device (e.g., according to $\omega = E/\hbar$). In some examples, a qubit frequency of a qubit device is tunable (e.g., a tunable qubit device), for example, by application of an offset field. For instance, a superconducting tunable qubit device (e.g., the example the tunable qubit devices 314, 502, 714, and 814 shown in FIGS. 3, 5, 7, 8, or another type of tunable qubit device) may include a circuit loop (e.g., a SQUID loop), which can receive a magnetic flux that tunes the qubit frequency of the tunable qubit device. As an example, the circuit loop may include a single non-linear circuit element (e.g., a single Josephson junction) connected between a first circuit node and a second circuit node, and one or more linear circuit elements (e.g., a linear inductor) connected in parallel with the non-linear circuit element between the first and second circuit node. At least one of the circuit nodes of the tunable qubit device may be connected to an electrically floating qubit electrode without electrically connecting to ground. The qubit electrode and the ground plane can be capacitively coupled by a shunt capacitor. In some implementations, a qubit frequency of the tunable qubit device may be defined at least in part by the Josephson energy of the single Josephson junction, the energy of the linear inductor, a capacitance of the shunt capacitor, and a magnetic flux threading the circuit loop.

In some examples, the qubit frequency of a qubit device is not tunable by application of an offset field and is independent of magnetic flux experienced by the qubit device. For instance, a fixed-frequency qubit device may have a fixed qubit frequency that is defined by an electronic circuit of the qubit device. As an example, a superconducting fixed-frequency qubit device (e.g., a fixed-frequency transmon qubit device) may be implemented without a SQUID loop.

In certain instances, each qubit device includes one qubit electrode. In this case, each qubit device is considered a "grounded" qubit device when the one or more Josephson junctions of the qubit device are connected between the qubit electrode and a ground plane (e.g., the Josephson junction and the linear inductor may be connected in parallel between the qubit electrode and a ground plane, as in the example shown in FIG. 3); and the shunt capacitor is caused by the qubit electrode and the ground plane. In other instances, each qubit device includes two qubit electrodes. In this case, the qubit device is considered a "floating" qubit device when the Josephson junction and the linear inductor of the qubit device are connected between the two qubit electrodes that are not directly connected to ground (e.g., the Josephson junction and the linear inductor may be connected in parallel between the two qubit electrodes, as in the example shown in FIGS. 7-8); and the shunt capacitor is caused by the two qubit electrodes. Both of the two qubit electrodes of a tunable qubit device are electrically floating at a certain potential without being conductively connected to a ground plane. In other words, neither of the two qubit electrodes is conductively coupled to ground. In some implementations, the electrodes of a tunable floating device can be capacitively coupled to the ground plane, e.g., through a residual capacitance between each of the two qubit electrodes and the ground plane.

Figure 3:
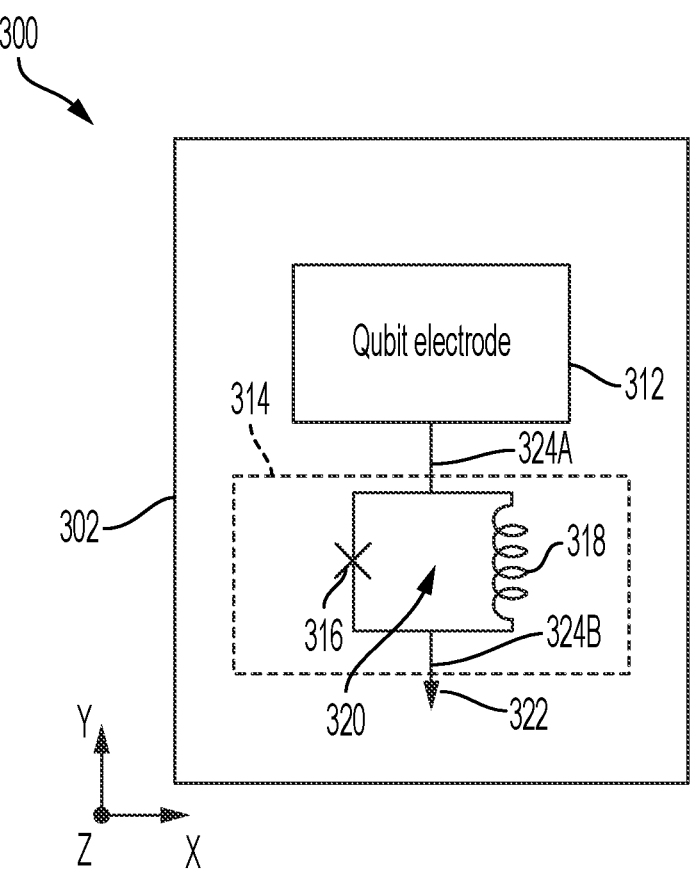
FIG. 3 is a schematic diagram of a top view of an example superconducting quantum processing circuit.

As a particular example, FIG. 3 shows an example tunable qubit device 314, which includes a circuit loop 320. The respective circuit loop 320 can receive a magnetic flux $\Phi(t)$ that controls the qubit frequency of the example tunable qubit device 314. Manipulating the magnetic flux $\Phi(t)$ through the circuit loop 320 can increase or decrease the qubit frequencies of the example tunable qubit device 314.

In this example, the magnetic flux $\Phi(t)$ through the circuit loop 320 is offset fields that can be modified in order to tune the qubit frequencies of the tunable qubit device 314. In some cases, inductors or other types of flux bias devices as part of flux bias control lines carrying the control signals 206 are coupled to the circuit loop 320 by a mutual inductance, and the magnetic flux $\Phi(t)$ through the circuit loop 320 can be controlled by the current through the inductors.

In some instances, information is encoded in the qubit devices in the quantum processing unit 204, and the information can be processed by operation of the qubit devices. For instance, input information can be encoded in the computational states or computational subspaces defined by some or all of the qubit devices in the quantum processing unit 204. The information can be processed, for example, by applying a quantum algorithm or other operations to the input information. The quantum algorithm may be decomposed as quantum logic gates or instruction sets that are performed by the qubit devices and other devices over a series of clock cycles. For instance, a quantum algorithm may be executed by a combination of single-qubit quantum logic gates and two-qubit quantum logic gates. In some cases, information is processed in another manner. Processing the information encoded in the qubit devices can produce output information that can be extracted from the qubit devices. The output information can be extracted, for example, by performing state tomography or individual readout operations. In some instances, the output information is extracted over multiple clock cycles or in parallel with the processing operations.

In some aspects of operation, the control system 202 sends control signals 206 to the qubit devices in the quantum processing unit 204. The control signals can be configured to modulate, increase, decrease, or otherwise manipulate the qubit frequencies of the qubit devices (e.g., when the qubit devices are tunable qubit devices). For example, the control signal can be a flux bias control signal that varies a magnetic flux experienced by the tunable qubit device, and varying the magnetic flux can change the qubit frequency of the tunable qubit device. In some implementations, a control signal 206 can be a direct current (DC) signal communicated from the control system 202 to the individual qubit device. In some implementations, a control signal can be an alternating current (AC) signal communicated from the control system 202 to the individual qubit device. In some cases, the AC signal may be superposed with a direct current (DC) signal. Other types of control signals may be used.

In the example shown in FIG. 2, the control system 202 sends control signals 206 to the tunable qubit device 214C to control the tunable qubit device 214A. In some cases, the control signals 206 can generate interactions between the tunable qubit device 214C and the neighboring qubit devices 212B, 212C. For instance, the control signals 206 can generate a first interaction 216A between the qubit device 212B and the tunable qubit device 214C, a second interaction 216B between the qubit device 212C and the tunable qubit device 214C, or a combination of them in series or in parallel.

In some cases, the control line (which receives the control signal 206) may include a flux bias device that is inductively coupled to the circuit loop of the tunable qubit device 214C to control the magnetic flux through a circuit loop in the tunable qubit device 214C. In some instances, the control line and the circuit loop are implemented as the control line 318 and the circuit loop 324 shown in FIG. 3.

In some instances, the control system 202 identifies a quantum logic gate to be applied the tunable qubit device 214C and possibly one or more other quantum devices in the quantum processing unit 204. The control system 202 can perform the quantum logic gate by communicating the control signal 206 to a control line that is coupled to the tunable qubit device 214C in the quantum processing unit 204.

FIG. 3 is a schematic diagram of a top view of an example superconducting quantum processing circuit 300. The example superconducting quantum processing circuit 300 includes superconducting quantum circuit devices. As shown in FIG. 3, the superconducting quantum circuit devices in the example superconducting quantum processing circuit 300 include a tunable qubit device 314. As shown in FIG. 3, the example superconducting quantum processing circuit 300 includes a qubit electrode 312 and a ground plane 322. The tunable qubit device 314 has a first circuit node 324A communicably coupled to the qubit electrode 312 and a second circuit node 324B communicably coupled to the ground plane 322. In some instances, the example superconducting quantum processing circuit 300 may include other superconducting quantum circuit devices.

As shown in FIG. 3, the qubit electrode 312 is electrically floating at a certain potential without being conductively connected to the ground plane 322. In some instances, the ground plane 322 is configured around superconducting quantum circuit devices and the qubit electrode 312 is capacitively coupled to the ground plane 322. In this case, a shunt capacitor can be formed between the qubit electrode 312 and the ground plane 322. As shown in the example equivalent circuit 500 of the example quantum processing circuit 300, the shunt capacitor 516 is caused by the capacitance coupling between the qubit electrode 312 and the ground plane 322. In some instances, the qubit electrode 312 is also capacitively coupled to a qubit drive line that allows controlling the qubit states.

In some examples, the tunable qubit devices 314 may be implemented by other types of systems, and the features and components represented in FIG. 3 can be extended in a larger two-dimensional or three-dimensional array of devices. The example quantum processing circuit 300 may include additional or different features and components, which may be configured in another manner. For example, the example quantum processing circuit 300 may include other types of qubit devices (e.g., fixed-frequency qubit devices or other types of tunable qubit devices) and coupler devices (e.g., tunable coupler devices) which can be used to provide coupling between qubit devices. For example, the example quantum processing circuit 300 may include respective readout resonator devices associated with the tunable qubit device 314 for performing readout operations. For another example, the example quantum processing circuit 300 may include control lines (e.g., flux bias control lines and/or qubit drive lines) for providing control signals and performing quantum logic operations.

The tunable qubit device 314 includes a circuit loop 320 that includes a single Josephson junction 316 and a linear inductor 318 connected in parallel. The Josephson junction 316 is a non-linear circuit element which has an inductance that has a non-linear relationship with the current flowing through it. The linear inductor 318 is an inductor which has an inductance value independent of the current running through the inductor. The linear inductor 318 and the single Josephson junction 316 are connected in parallel between two circuit nodes 324A/324B. In some instances, the linear inductor 318 and the single Josephson junction 316 are connected through electrical connections, for example, conductive vias, metallization lines, and other linear circuit elements.

In some implementations, the linear inductor 318 is a conductive stripline. In some instances, the linear inductor 318 includes a planar conductive stripline which may be patterned and fabricated when the qubit electrode 312, the ground plane 322, or other superconducting quantum circuit devices of the example superconducting quantum processing circuit 300 is fabricated, e.g., on a substrate 302. In certain instances, a conductive stripline of the linear inductor 318 may be in a form of a straight line, a meander line, a single-turn loop, a spiral (e.g., circular, square, octagonal, or another shape) with more than one turn, or in another shape. In some instances, the linear inductor can be a superconducting wiring with non-negligible kinetic inductance. The kinetic inductance of superconducting wire can be approximated by $$ L_K = \frac{m_e}{2n_d e^2} \frac{l}{A} \qquad (1) $$

where e and $m_e$ are charge and mass of an electron; $n_d$ is the density of Cooper pairs, and l and A are the length and cross-sectional area of the superconducting wire. A superconducting wire can be formed by a superconducting material, for example, aluminum (Al), Niobium (Nb), TiN, or NbTiN, etc. As shown in Equation 1, the kinetic inductance can be increased by reducing the cross-sectional area (A) of a superconducting wire. In some implementations, a non-negligible kinetic inductance is a kinetic inductance above a threshold value, such as, for example, above 0.1, 0.5, 1, 5, 10 nanoHenry (nH) or a different threshold value. In some implementations, a superconducting wire has a planar structure. For example, a superconducting wire may include a stripline, a coplanar waveguide, a microstrip, or another planar transmission line.

Figure 4:
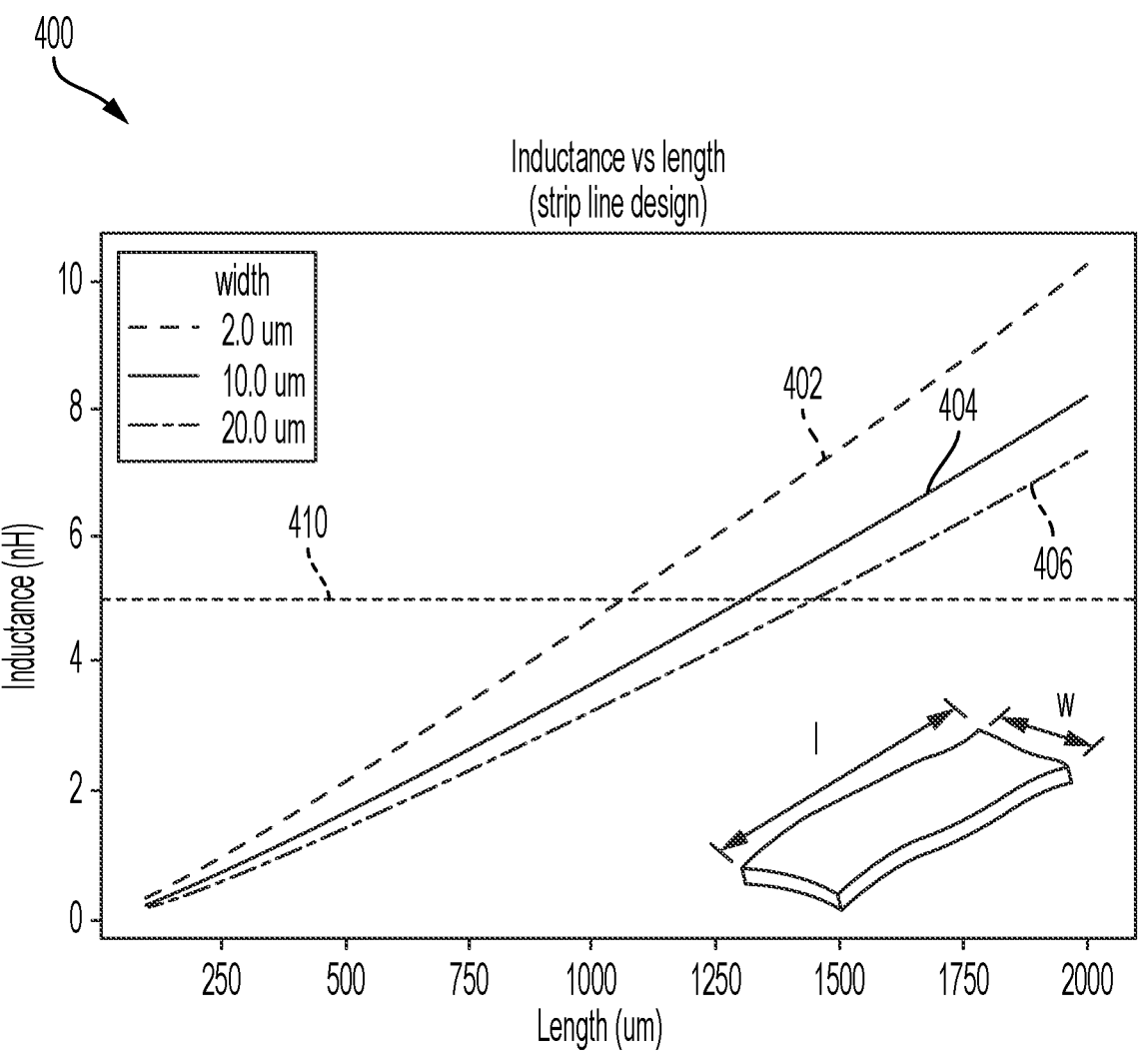
FIG. 4 a plot showing an inductance as a function of a length of a linear inductor.

FIG. 4 is a plot 400 showing an inductance as a function of a length of a linear inductor. The linear inductor is a conductive stripline in a form of a straight line. The inductance of such conductive stripline can be approximated by the equation below:

$$ L \approx \frac{1}{2}\mu_0 l \left[ \ln\left(\frac{2l}{w}\right) + 0.5 \right] \qquad (2) $$

where $\mu_0$ is the permeability of vacuum, l and w are the length and width of the conductive stripline, respectively. As shown in FIG. 4, the inductance of a conductive stripline increases with the length. Curve 402 shows the inductance as a function of the length at a first fixed width of 2 micrometers (μm); curve 404 shows the inductance as a function of the length at a second fixed width of 10 μm; and curve 406 is the inductance as a function of the length with a third fixed width of 20 μm. For example, to obtain an inductance of 5 nH (as represented by the dotted line 410), the length of the conductive stripline is ~1000 μm when the width is 2 μm; ~1250 μm when the width is 10 μm; and ~1500 μm when the width is 20 μm. In some instances, the inductance of the linear inductor in another shape is geometrical and can be approximated by its geometric dimensions.

Assuming the variation of the inductance of the conductive stripline caused by the fabrication process is negligible, the variation in the qubit frequency of the qubit (e.g., ratio of the variation of the qubit frequency and the qubit frequency) defined by the tunable qubit device with the conductive stripline as the linear inductor 318 is primarily caused by the variation in the single Josephson junction 316, which can be given by:

$$ \frac{\delta\omega_{01}}{\omega_{01}} = \frac{1}{2}\frac{\delta L_J}{L_J} \qquad (3) $$

where $\delta\omega_{01}$ is the variation of the qubit frequency, $\omega_{01}$ is the qubit frequency, and $\delta L_J$ is the variation in the inductance of the Josephson junction. The variation in the qubit frequency of a tunable qubit device caused by the variations in the fabrication process can be smaller than the that of a tunable qubit device with two asymmetric Josephson junctions connected in parallel between two circuit nodes. For example, the relative frequency spread for a transmon qubit device with two asymmetric Josephson junctions can be defined by:

$$ \frac{\delta\omega_{01}}{\omega_{01}} = \frac{1}{2}\frac{L_{J1}L_{J2}}{L_{J1}+L_{J2}}\left(\frac{\delta L_{J1}}{L_{J1}^2} + \frac{\delta L_{J2}}{L_{J2}^2}\right) \qquad (4) $$

The relative frequency spread depends on the inductances of both Josephson junctions and corresponding variations. The systems and techniques presented here can reduce the relative frequency spread by reducing variations caused by the fabrication process.

In some implementations, the circuit loop 320 can be inductively coupled to (has a mutual inductance with) a flux bias control line, which can tune a magnetic flux in the circuit loop 320. The flux bias control line is connected to an external control system (e.g., the control system 202 in FIG. 2) which is configured to generate respective flux control signals. The Josephson junction 316 and the linear inductor 318 in the circuit loop 320 form an asymmetric Superconducting Quantum Interference Device (SQUID). In some instances, the tunable qubit device 314 may include additional or different features, and may operate as described with respect to FIG. 3 or in another manner. For example, the linear inductor 318 and the Josephson junction 316 are galvanically connected through electrical connections, for example, conductive vias, metallization lines, and other linear circuit elements. For another example, the linear inductor 318 may include more than two Josephson junctions connected in series, e.g., the tunable qubit device 314 may be implemented as the tunable qubit devices 700, 800 in FIGS. 7-8.

The example quantum processing circuit 300 shown in FIG. 3 resides on the top surface of the substrate 302. In certain instances, the substrate 302 may be an elemental semiconductor, for example silicon (Si), germanium (Ge), selenium (Se), tellurium (Te), or another elemental semiconductor. In some instances, the substrate 302 may also include a compound semiconductor such as aluminum oxide (sapphire), silicon carbide (SiC), gallium arsenic (GaAs), indium arsenide (InAs), indium phosphide (InP), silicon germanium (SiGe), silicon germanium carbide (SiGeC), gallium arsenic phosphide (GaAsP), gallium indium phosphide (GaInP), or another compound semiconductor. In some instances, the substrate 302 may also include a superlattice with elemental or compound semiconductor layers. In certain instances, the substrate 302 includes an epitaxial layer. In some examples, the substrate 302 may have an epitaxial layer overlying a bulk semiconductor or may include a semiconductor-on-insulator (SOI) structure.

The qubit electrode 312, the ground plane 322, and the linear inductor 318 include superconductive materials and can be formed by patterning one or more superconductive (e.g. superconducting metal) layers or other materials on the surface of the substrate 302. In some implementations, each of the one or more superconductive layers include a super-conducting metal, such as aluminum (Al), niobium (Nb), tantalum (Ta), titanium (Ti), vanadium (V), tungsten (W), zirconium (Zr), or another superconducting metal. In some implementations, each of the one or more superconductive layers may include a superconducting metal alloy, such as molybdenum-rhenium (Mo/Re), niobium-tin (Nb/Sn), or another superconducting metal alloy. In some implementations, each of the superconductive layers may include a superconducting compound material, including supercon-ducting metal nitrides and superconducting metal oxides, such as titanium-nitride (TiN), niobium-nitride (NbN), zir-conium-nitride (ZrN), hafnium-nitride (HfN), vanadium-nitride (VN), tantalum-nitride (TaN), molybdenum-nitride (MoN), yttrium barium copper oxide (Y—Ba—Cu—O), or another superconducting compound material. In some instances, the qubit electrode 312 and the ground plane 322 may include multilayer superconductor-insulator hetero-structures. In some instances, the linear inductor 318 may include the same material as the qubit electrode 312 or the ground plane 322. In some instances, another material, for example, with high kinetic inductances (e.g., NbTiN and TiN) can be used to generate an extra inductance and reduce the physical size of the linear inductor 318. In certain example, other linear circuit elements (e.g., electrical con-nections between the linear inductor 318 and the Josephson junction 316) are also fabricated using the same materials in the same process, or fabricated in another manner.

In some implementations, the qubit electrode 312, the Josephson junction 316, the linear inductor 318, and the ground plane 322 are fabricated on the top surface of the substrate 302 and patterned using a microfabrication process or in another manner. For example, the qubit electrode 312, the Josephson junction 316, the linear inductor 318, and the ground plane 322 may be formed by performing at least some of the following fabrication steps: using chemical vapor deposition (CVD), physical vapor deposition (PVD), atomic layer deposition (ALD), spin-on coating, and/or other suitable techniques to deposit respective supercon-ducting layers on the substrate 302; and performing one or more patterning processes (e.g., a lithography process, a dry/wet etching process, a soft/hard baking process, a clean-ing process, etc.) to form openings in the respective super-conducting layers.

Figure 5:
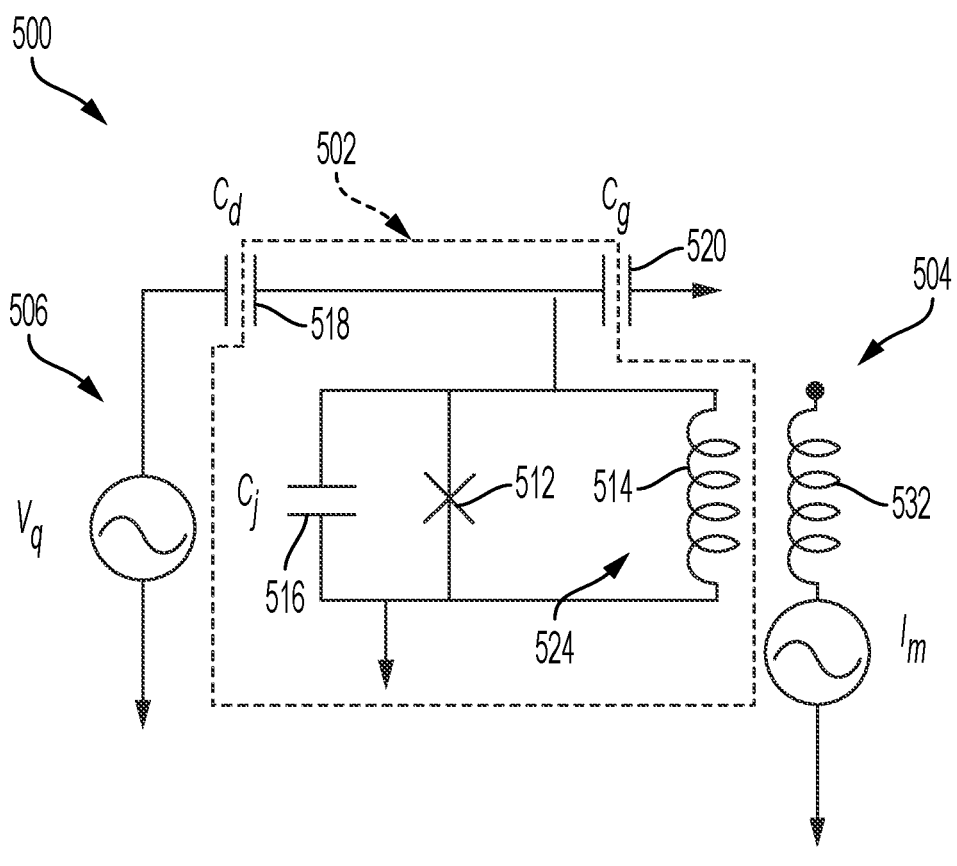
FIG. 5 is a circuit diagram showing an example equivalent circuit of the example superconducting quantum processing circuit in FIG. 3.

FIG. 5 is a circuit diagram showing an example equivalent circuit 500 of the example superconducting quantum pro-cessing circuit 300 in FIG. 3. The example equivalent circuit 500 represented in FIG. 5 includes a tunable qubit device 502, a flux bias control line 504, and a qubit drive line 506. For instance, the equivalent circuit 500 in FIG. 5 can represent a qubit device in the quantum processing unit 204 in FIG. 2, the tunable qubit device 314 in the quantum processing circuit 300 in FIG. 3, or another tunable device in another type of system or environment.

In the example shown in FIG. 5, the tunable qubit device 502 is implemented as a tunable-frequency transmon qubit device. As shown, the tunable qubit device 502 includes a single Josephson junction 512 and a linear inductor 514. The Josephson junction 512 having a Josephson energy E is connected in parallel with the linear inductor 514 to form a circuit loop 524. The circuit loop 524 is inductively coupled to a flux bias control line 504 which includes a flux bias device 532. The tunable qubit device 502 also includes a shunt capacitor 516 with a capacitance CJ, which is con-nected in parallel with the Josephson junction 512 and the linear inductor 514. The shunt capacitor 516 is caused by the capacitive coupling between a qubit electrode and a ground plane (e.g., between the qubit electrode 312 and the ground plane 322 as shown in the tunable qubit device 314 in FIG. 3) when the tunable qubit device is a tunable grounded qubit device. In some other examples, the shunt capacitor 516 is caused by a capacitive coupling between two qubit elec-trodes when the tunable qubit device is a tunable floating qubit device.

In the example shown in FIG. 5, the tunable qubit device 502 is capacitively coupled to the qubit drive line 506 for receiving a qubit drive signal through a first residual capaci-tor 518. The tunable qubit device 502 is further capacitively coupled to the ground plane through a second residual capacitor 520. In some instances, the tunable qubit device 502 is capacitively coupled to the qubit drive line 506 and the ground plane through the qubit electrode, e.g., the qubit electrode 312 as shown in the tunable qubit device 314 in FIG. 3.

In some implementations, control operations can be per-formed on the quantum processing circuit by providing control signals to the tunable qubit device 502 via the flux bias control line 504. The flux bias control line 504 receives the flux control signals, for example, from an external control system. In some implementations, the flux bias control line 504 includes a flux bias device 532, which can be a conductor or another type of circuit component, con-figured to carry a respective current $I_m$ and generate a magnetic flux $\phi$ (t) through the circuit loop 524. For instance, the flux bias device 532 may include an inductor (e.g., a partial loop, a single loop, or multiple loops of a conductor) that has a mutual inductance with the circuit loop 524. In the example shown, the qubit frequency of the tunable qubit device 502 is tuned by tuning the magnetic flux de in the circuit loop 524. In some instances, the qubit frequency may be controlled in another manner, for instance, by another type of control signal. In some implementations, the flux bias control line 504 may include an inductance loop or another type of flux bias device 532 that is coupled (e.g., conductively, capacitively, or inductively) to a control port to receive control signals, and to the tunable qubit device 502. In certain instances, the flux control signals on the flux bias control line 504 may cause the flux bias device 532 to generate and modulate the magnetic flux in the circuit loop 524. In some implementations, the flux control signals on the flux bias control line 504 are implemented as the control signals 206 as shown in FIG. 2.

The tunable qubit device 502 may be coupled with other superconducting quantum logic circuit devices, e.g., a fixed-frequency qubit device or another tunable qubit device. In some implementations, the coupling between the tunable qubit device 502 and another qubit device is through a tunable coupler device, or the qubit device 502 maybe directly connected to another qubit device (e.g., through a capacitive or galvanic connection in the circuit).

In some implementations, the energies of the Josephson junction 512 and the linear inductor 514 of the tunable qubit devices 502 that form the circuit loop 524 are highly asymmetric (e.g., $E_j \ll E_L$). The strong asymmetry can result in narrow tunability of the tunable qubit device 502 and thus reduce sensitivity of the tunable qubit devices 502 to flux noise thereby improving their coherence times. In some examples, tunability of the tunable qubit device is defined by the maximal frequency and the minimal frequency of the tunable qubit device, e.g., tunability=maximal frequency−minimal frequency, where the maximal frequency occurs at a flux bias of 0 and the minimal frequency occurs at a qubit flux bias of $0.5\Phi_0$, where $\Phi_0$ is flux quantum (a constant).

The Hamiltonian of the equivalent circuit 500 shown in FIG. 5 is defined by:

$$H = 4E_C(\hat{n} - n_g)^2 - E_J\cos(\hat{\phi} - 2\pi\phi_{ext}) + \frac{E_L}{2}\hat{\phi}^2 \tag{5}$$

where $E_C$ is the charging energy, e.g., $E_C=e^2/2C_\Sigma$; $C_\Sigma$ is the total capacitance, e.g., $C_\Sigma=C_g+C_J+C_d$; $E_J$ is the junction energy of the Josephson junction 512, e.g., $E_J=(\Phi_0/2\pi)^2/L_J$; and $E_L$ is the energy of the linear inductor 514, e.g., $E_L=(\Phi_0/2\pi)^2/L$; and $\phi_{ext}=\Phi_{ext}/\Phi_0$ is the reduced flux. The inductance L of the linear inductor 514 is geometrical. In other words, the inductance of the linear inductor 514 is determined by the geometric dimensions of the linear inductor 414 and independent from the current running through the linear inductor 514. In some implementations, the linear inductor 514 can be formed from an array of Josephson junctions of the same area and inductance (e.g., the linear inductor 818 shown in FIG. 8).

Figure 6:
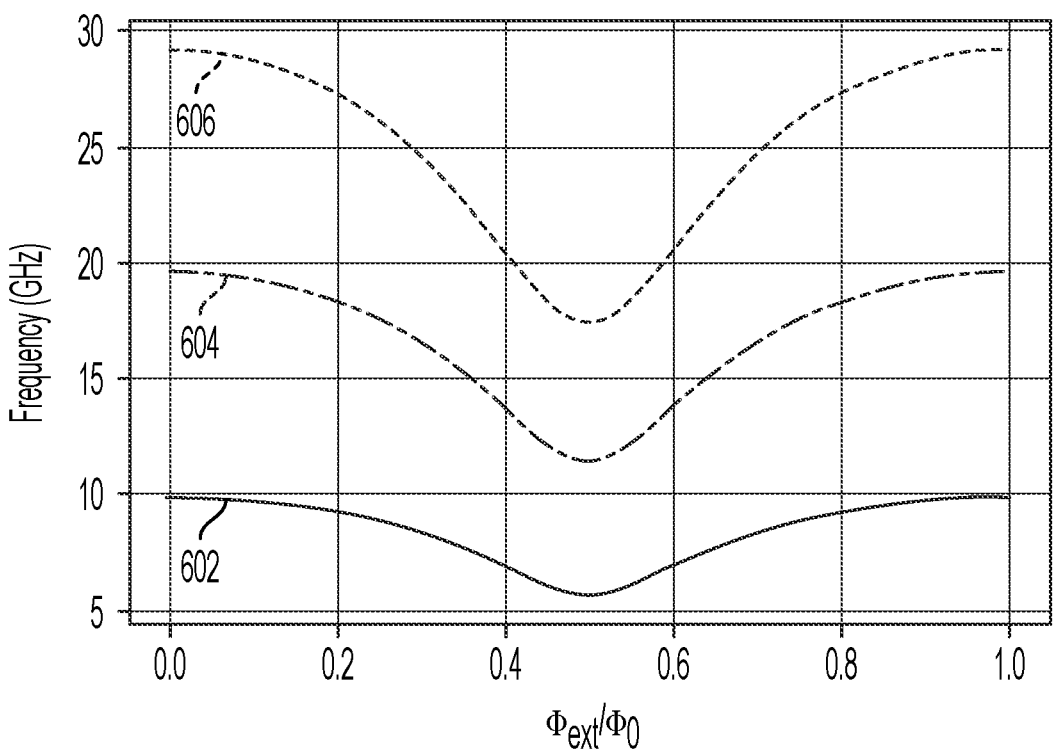
FIG. 6 is a plot showing a qubit frequency of a tunable qubit device as a function of a flux bias applied to the tunable qubit device in the example superconducting quantum processing circuit in FIG. 3 represented by the example equivalent circuit in FIG. 4.

FIG. 6 is a plot 600 showing a qubit frequency of the tunable qubit device as a function of a flux bias. The tunable qubit device may be implemented as the example tunable qubit device 314, 502 in FIGS. 3 and 5. Values of circuit parameters used for obtaining the plot 600 include: $E_J/h=18$ GHz, which corresponds to an inductance of the Josephson junction of 9 nH, e.g., $L_J=9$ nH; $E_C/h=0.24$ GHz which corresponds to a total capacitance of 80 femtofarads (fF), e.g., $C_\Sigma=80$ fF, and $E_L/h=32$ GHz which corresponds to an inductance of the linear inductor of 5 nH, e.g., L=5 nH.

In general, a tunable qubit device can be characterized by qubit device parameters. In some instances, qubit device parameters that can be used to characterize a tunable qubit device include a range of qubit operating frequencies. In certain examples, a range of qubit operating frequencies is defined by a maximal frequency value, e.g., the $|0\rangle \rightarrow |1\rangle$ qubit frequency value at a magnetic flux of zero flux quantum applied to the tunable qubit device, $$\omega_{01}(\phi_{ext} = 0) \equiv \omega_{01}^{max} \tag{6}$$

and a minimum frequency value, e.g., the $|0\rangle \rightarrow |1\rangle$ qubit frequency value at a magnetic flux of half-flux quantum, $$\omega_{01}\left(\phi_{ext} = \frac{\phi_0}{2}\right) \equiv \omega_{01}^{min} \tag{7}$$

anharmonicity at the magnetic flux of zero flux quantum, $$\eta(\phi_{ext} = 0) \equiv \eta^{max} \tag{8}$$

and the applied flux $\Phi_{ext}$, e.g., $$Q = Q(\omega_{01}^{max}, \omega_{01}^{min}, \eta^{max}, \phi_{ext}) \tag{9}$$

In some implementations, the qubit device parameters may include one or more of the qubit device parameters of the tunable qubit device in the superconducting quantum processing circuit. For example, qubit device parameters, such as the drive frequency, a range of qubit operating frequencies (e.g., minimum and maximum qubit frequencies $$\omega_{01}^{min} \text{ and } \omega_{01}^{max}),$$

a maximum qubit frequency $f_{12_{max}}$, and an anharmonicity ($\eta$) of the tunable qubit device at the maximum qubit frequency $f_{12_{max}}$ can also be obtained. In certain instances, circuit parameters of circuit components in an equivalent circuit representing the superconducting quantum processing circuit can be obtained based on the qubit device parameters. For example, the circuit parameters, such as, the Josephson junction energy $E_J$ of the Josephson junction in the circuit loop 320, and the charging energy $E_C$ of the tunable qubit device 300, can be determined.

In some examples, the qubit operating frequency is measured by using qubit spectroscopy to measure the qubit frequency from the ground state $|0\rangle$ to the first excited state $|1\rangle$ of the tunable qubit device. Ramsey interferometry can then be used to fine tune the value of the qubit operating frequency obtained from the spectroscopic measurement. In some instances, the qubit operating frequency can be measured at one or more reference values of the applied magnetic flux. For example, the qubit operating frequency of a tunable qubit device can be measured at zero flux and one-half flux quantum; the tunable qubit devices may be measured under other flux conditions.

In some examples, after the qubit operating frequencies of the tunable qubit device are obtained, qubit spectroscopy can be used to measure the qubit frequency from the ground state $|0\rangle$ to the second excited state $|2\rangle$ which can be used to calculate the anharmonicity of the tunable qubit device. For instance, the absolute value of the anharmonicity of a tunable qubit device may be computed as $|\eta|=2\omega_{01}-\omega_{02}$, where $\omega_{01}$ represents the qubit frequency from the ground state $|0\rangle$ to the first excited state $|1\rangle$ of the tunable qubit device, and $\omega_{02}$ represents the qubit frequency from the ground state $|0\rangle$ to the second excited state $|2\rangle$ of the tunable qubit device.

As shown in FIG. 6, the first qubit frequency ($f_{01}$) of the tunable qubit device, represented by a first curve 602, varies in a range of about 5 and 10 GHz; the second qubit frequency ($f_{02}$) of the tunable qubit device, represented by a second curve 604, varies in a range of about 10.5 and 20 GHz; and the third qubit frequency ($f_{03}$) of the tunable qubit device, represented by a third curve 606, varies in a range of about 17.5 and 30 GHz. At $\Phi_{ext}/\Phi_0=0.5$, $f_{01}=5.5$ GHz and $f_{02}=10.769$ GHz with corresponding absolute value of the anharmonicity $|\eta|=2f_{01}-f_{02}=231$ Megahertz (MHz). The value of the anharmonicity of the qubit is used for reducing leakage to upper levels when performing quantum logic operation using the tunable qubit device (e.g., single-qubit, two-qubit, or multi-qubit quantum logic gates). When the tunable qubit device is operated at zero flux bias (e.g., $\Phi_{ext}/\Phi_0=0$) in the frequency of interest (e.g., in a range of 4-6 GHz or another range), the anharmonicity of the qubit may be reduced substantially, e.g., <100 MHz. In some instances, the inductance of the linear inductor can be in a range of 3-6 nH, 3-8 nH, 1-10 nH, or another range in order to obtain a qubit frequency in a range of 1-20 GHz, or another range, respectively.

In some instances, after the qubit device parameters are obtained, operating conditions are determined. In some implementations, a control signal includes a flux bias control signal which can be communicated to the tunable qubit device on a flux bias control line (e.g., the flux bias control line 504 in FIG. 5). In certain instances, the control signal also includes a qubit drive signal which can be communicated to the tunable qubit device on a qubit drive control line (e.g., the qubit drive line 506 in FIG. 5) to activate a single-qubit quantum logic gate. In some instances, the operation conditions are determined by configuring control signals (e.g., flux bias control signal and the qubit drive signal) which are characterized by control signal parameters. After the control signal parameters are determined, a quantum logic gate operation can be performed. In some implementations, the flux bias control signal and the qubit drive signal are formed according to the operating conditions, by operation of a control system; and applied to the tunable qubit device. The flux bias control signal can drive the qubit defined by the tunable qubit device and perform the quantum logic gate. In some implementations, in order to perform the quantum logic gate on the qubit defined by the tunable qubit device, one or more control signals are communicated from the control system to the tunable qubit device. The tunable qubit device has a range of qubit operating frequencies. In some instances, the range of qubit operating frequencies is determined when the qubit device parameters are determined.

Figure 7:
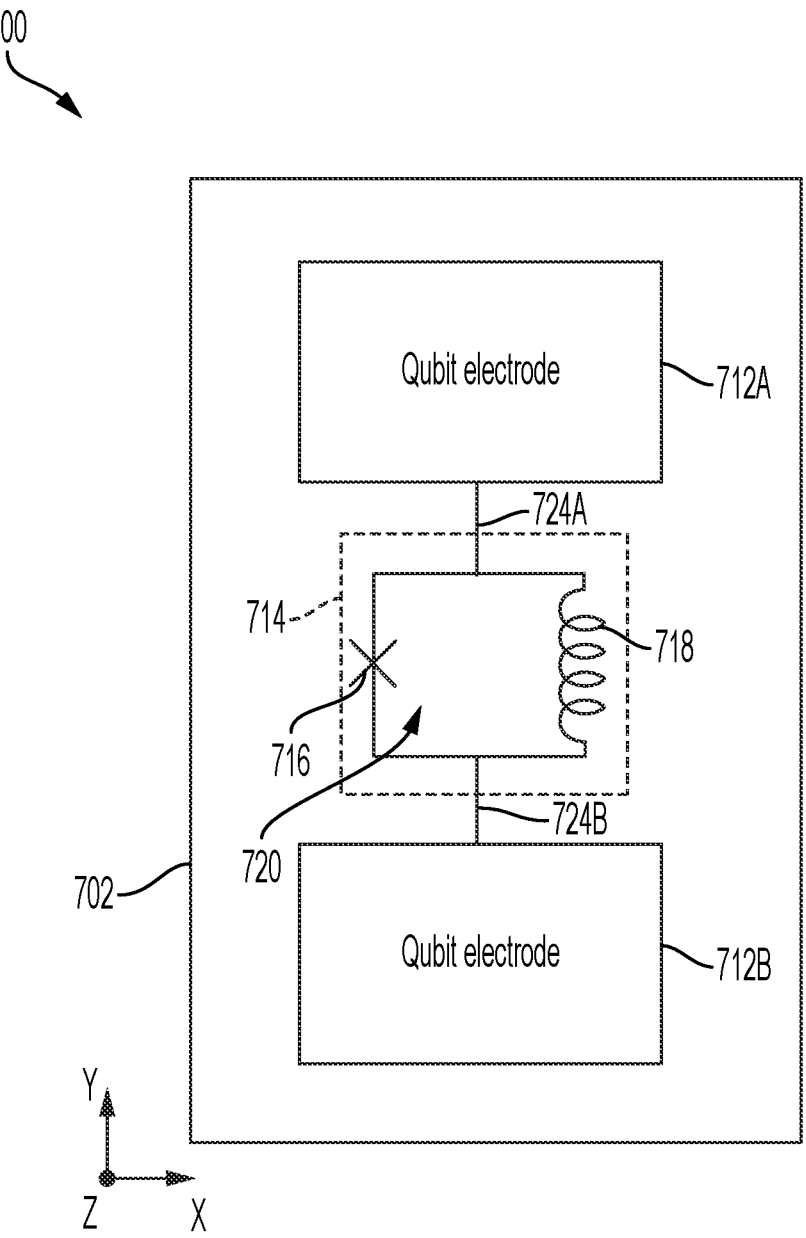
FIG. 7 is a schematic diagram showing a top view of an example superconducting quantum processing circuit.

FIG. 7 is a schematic diagram of a top view of an example quantum processing circuit 700. The example quantum processing circuit 700 includes superconducting quantum circuit devices. As shown in FIG. 7, the superconducting quantum circuit devices in the example quantum processing circuit 700 include a tunable qubit device 714. The superconducting quantum circuit devices of the example quantum processing circuit 700 shown in FIG. 7 resides on the top surface of a substrate 702. The substrate 702 may be implemented as the substrate 302 in FIG. 3. The example quantum processing circuit 700 may include additional or different features and components, which may be configured in another manner. For example, the superconducting quantum circuit devices may include readout resonator devices associated with the tunable qubit device 714 for performing readout operations. For another example, the example quantum processing circuit 700 may include control lines (e.g., flux bias control lines and/or qubit drive lines) for providing control signals (e.g., to activate or deactivate coupling between the tunable qubit device 714) and performing multi-qubit quantum logic gates.

The tunable qubit device 714 includes a circuit loop 720 including a Josephson junction 716 and a linear inductor 718. The tunable qubit device 714 may be implemented as the tunable qubit device 714 as shown in FIG. 3 or in another manner. As shown in FIG. 7, the tunable qubit device 714 includes a pair of identical qubit electrodes 712A/712B having the same shape of footprint and the same size of the footprint. As shown in FIG. 7, each of the qubit electrodes 712A/712B has a rectangular footprint. In some instances, the qubit electrodes 712A/712B of the tunable qubit device 714 are asymmetric. For example, the qubit electrodes 712A/712B may have different shapes of footprints and/or different areas of the footprints. The pair of qubit electrodes 712A/712B connected to first and second circuit nodes 724A/724B of the tunable qubit device 714 are electrically floating at certain electrical potentials without being connected to a ground plane. In some implementations, the tunable qubit device 714 is a tunable floating qubit device.

Figure 8:
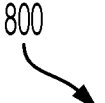
FIG. 8 is a schematic diagram showing a top view of an example superconducting quantum processing circuit.
Figure 8:
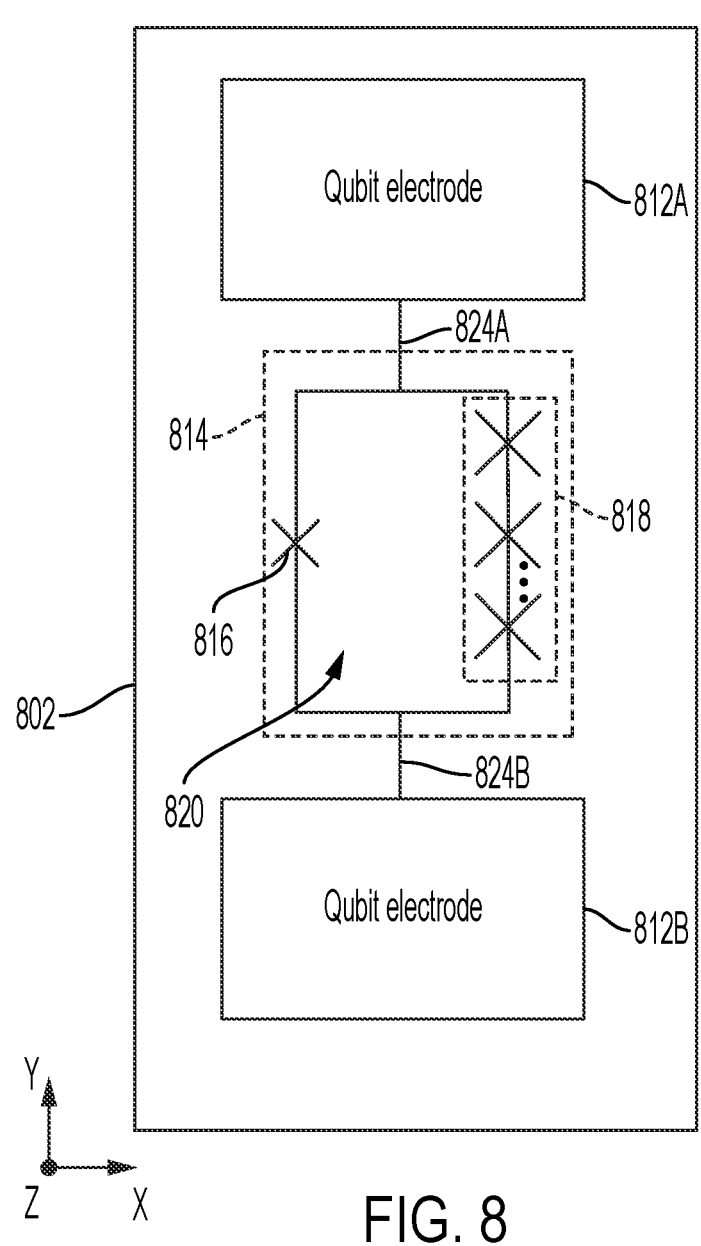

FIG. 8 is a schematic diagram of a top view of an example quantum processing circuit 800. The example quantum processing circuit 800 includes superconducting quantum circuit devices. As shown in FIG. 8 the superconducting quantum circuit devices in the example quantum processing circuit 800 include a tunable qubit device 814. The superconducting quantum circuit devices of the example quantum processing circuit 800 shown in FIG. 8 resides on the top surface of a substrate 802. The substrate 802 may be implemented as the substrate 302 in FIG. 3. The example quantum processing circuit 800 may include additional or different features and components, which may be configured in another manner. For example, the superconducting quantum circuit devices may include readout resonator devices associated with the tunable qubit device 814 for performing readout operations. For another example, the example quantum processing circuit 800 may include control lines (e.g., flux bias control lines and/or qubit drive lines) for providing control signals (e.g., to activate or deactivate coupling between the tunable qubit device 814) and performing multi-qubit quantum logic gates.

The tunable qubit device 814 includes a respective circuit loop 820 including a Josephson junction 816 and a linear inductor 818. The Josephson junction 816 may be implemented as the Josephson junction 316 in FIG. 3, the Josephson junction 716 in FIG. 7, or in another manner. As shown in FIG. 8, the linear inductor 818 includes multiple Josephson junctions connected in series. Each of the Josephson junctions in the linear inductor 818 are design in a way that the phase drop across the junction is linear, e.g., $\sin \varphi \sim \varphi$, which leads to linear relation between the current and the phase $I = \varphi L_{Ak}$, where $L_{Ak}$ is the linear inductor of the $k^{th}$ junction. The linear current-phase relation can be achieved by designing a junction with a large area, for example, in a range between 200 nm×1000 nm and 200 nm×2000 nm. In other words, each of the Josephson junctions in the linear inductor 818 works as a linear component, which is distinct from the Josephson junction 816, e.g., with an area of 200 nm×200 nm, in the other branch of the circuit loop 820. In some implementations, the number of Josephson junctions in the linear inductor 818 is in a range of 2-150. The total inductance of the linear inductor 818 due large-area Josephson junctions connected in series is $$L = \sum_{k=1}^{N_A} L_{Ak}.$$

In some instances, the total inductance of the linear inductor 818 is in a range of 5-300 nH. As shown in FIG. 8, a pair of qubit electrodes 812A/812B connected to first and second circuit nodes 824A/824B of the tunable qubit device 814 may be implemented as the qubit electrodes 712A/712B of the example quantum processing circuit 700 in FIG. 7 or in another manner.

In a general aspect, a superconducting quantum processing circuit with tunable qubit devices is presented.

In a first example, a superconducting quantum processing circuit includes a tunable qubit device. The tunable qubit device includes a circuit loop configured to receive, during operation of the tunable qubit device, a magnetic flux that controls a qubit frequency of the tunable qubit device. The circuit loop consists of a single non-linear circuit element and one or more linear circuit elements. The single non-linear circuit element is a Josephson junction connected between a first circuit node and a second circuit node. The one or more linear circuit elements includes a linear inductor connected in parallel with the Josephson junction between the first circuit node and the second circuit node. The linear inductor is a conductive stripline.

Implementations of the first example may include one or more of the following features. The conductive stripline is a superconducting material formed in a straight line. The conductive stripline is a superconducting wire. The tunable qubit device includes two qubit electrodes; and the two qubit electrodes are electrically floating and are conductively connected to the first and second circuit nodes, respectively. The tunable qubit device includes two qubit electrodes; the two qubit electrodes are conductively connected to the first and second circuit nodes, respectively; and one of the two qubit electrodes is conductively connected to ground. The tunable qubit device includes two qubit electrodes; the two qubit electrodes are capacitively connected to ground and are conductively connected to the first and second circuit nodes, respectively. The superconducting quantum processing circuit further includes a flux bias control line associated with the tunable qubit device. The flux bias control line includes a flux bias device configured to generate the magnetic flux that controls the qubit frequency of the tunable qubit device. The linear inductor has an inductance in a range of 3-6 nH, 3-8 nH, or 1-10 nH. The qubit frequency of the tunable qubit device is in a range between 1 and 10 GigaHertz (GHz). The tunable qubit devices is a transmon tunable-frequency qubit device.

In a second example, a quantum computing method includes: operating a superconducting quantum processing circuit. The superconducting quantum processing circuit includes a tunable qubit device which includes a circuit loop consisting of: a single non-linear circuit element being a Josephson junction connected between a first circuit node and a second circuit node; and one or more linear circuit elements which includes a linear inductor connected in parallel with the Josephson junction between the first circuit node and the second circuit node. Operating the superconducting processing circuit includes applying, to the circuit loop of the tunable qubit device, a magnetic flux that controls a qubit frequency of the tunable qubit device.

Implementations of the second example may include one or more of the following features. The superconducting quantum processing circuit includes a flux bias control device associated with the tunable qubit device. Applying the magnetic flux to the circuit loop includes generating the magnetic flux by operation of the flux bias device. Generating the magnetic flux by operation of the flux bias device includes generating a flux bias control signal by operation of a control system; and delivering the flux bias control signal to the flux bias device. The superconducting quantum processing circuit includes a flux bias control line communicably coupled to the flux bias device, and delivering the flux bias control signal to the flux bias device comprises delivering the flux bias control signals to the flux bias device via the flux bias control line. Operating the superconducting quantum processing circuit includes applying a qubit drive signal to the tunable qubit device. The superconducting quantum processing circuit includes a qubit drive line. Applying the qubit drive signal to the tunable qubit device includes delivering the qubit drive signal to the tunable qubit device via the qubit drive line. The flux bias control signal is configured to tune the magnetic flux applied to the tunable qubit device between a parking value and a gate-activating value. Operating the superconducting quantum processing circuit includes activating a single-qubit quantum logic gate on the tunable qubit device by applying the drive signal at a qubit drive frequency; and tuning the magnetic flux to the gate-activating value. Operating the superconducting quantum processing circuit includes applying a quantum logic gate to a qubit defined by the tunable qubit device, and applying the quantum logic gate comprises applying the magnetic flux to the circuit loop.

In a third example, a quantum computing system includes a superconducting quantum processing circuit and a control system configured to operate the superconducting quantum processing circuit. The superconducting quantum processing circuit includes a tunable qubit device. The tunable qubit device includes a circuit loop configured to receive, during operation of the qubit device, a magnetic flux that controls a qubit frequency of the tunable qubit device. The circuit loop consists of a single non-linear circuit element which is a Josephson junction connected between a first circuit node and a second circuit node; and one or more linear circuit elements which include a linear inductor connected in parallel with the Josephson junction between the first circuit node and the second circuit node.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple implementations separately or in any suitable sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:

1. A superconducting quantum processing circuit comprising:

a tunable qubit device, wherein the tunable qubit device is a tunable-frequency transmon qubit device comprising a circuit loop configured to receive, during operation of the tunable qubit device, a magnetic flux that controls a qubit frequency of the tunable qubit device, the circuit loop consisting of:

a single non-linear circuit element, the single non-linear circuit element being a Josephson junction connected between a first circuit node and a second circuit node; and one or more linear circuit elements, the one or more linear circuit elements comprising a linear inductor connected in parallel with the Josephson junction between the first circuit node and the second circuit node, wherein the linear inductor is a conductive stripline, and the conductive stripline is a superconducting material formed as a straight line.

2. The superconducting quantum processing circuit of claim 1, wherein the conductive stripline is a superconducting wire.

3. The superconducting quantum processing circuit of claim 1, wherein the conductive stripline is a superconducting wire with non-negligible kinetic inductance.

4. The superconducting quantum processing circuit of claim 1, wherein the tunable qubit device comprises two qubit electrodes, the two qubit electrodes are electrically floating and are conductively connected to the first and second circuit nodes, respectively.

5. The superconducting quantum processing circuit of claim 1, wherein the tunable qubit device comprises two qubit electrodes, the two qubit electrodes are conductively connected to the first and second circuit nodes, respectively, and one of the two qubit electrodes is conductively connected to ground.

6. The superconducting quantum processing circuit of claim 1, wherein the tunable qubit device comprises two qubit electrodes, the two qubit electrodes are capacitively connected to ground and are conductively connected to the first and second circuit nodes, respectively.

7. The superconducting quantum processing circuit of claim 1, further comprising:
    a flux bias control line associated with the tunable qubit device, the flux bias control line comprising a flux bias device configured to generate the magnetic flux that controls the qubit frequency of the tunable qubit device.

8. The superconducting quantum processing circuit of claim 1, wherein the linear inductor has an inductance in a range between 1 and 10 nanoHenry (nH).

9. The superconducting quantum processing circuit of claim 1, wherein the linear inductor has an inductance in a range between 3 and 6 nH.

10. The superconducting quantum processing circuit of claim 1, wherein the linear inductor has an inductance in a range between 3 and 8 nH.

11. The superconducting quantum processing circuit of claim 1, wherein the qubit frequency of the tunable qubit device is in a range between 1 and 10 GigaHertz (GHz).

12. A quantum computing method comprising:
    operating a superconducting quantum processing circuit comprising a tunable qubit device, wherein the tunable qubit device is a tunable-frequency transmon qubit device comprising a circuit loop consisting of:
        a single non-linear circuit element, the single non-linear circuit element being a Josephson junction connected between a first circuit node and a second circuit node; and
        one or more linear circuit elements, the one or more linear circuit elements comprising a linear inductor connected in parallel with the Josephson junction between the first circuit node and the second circuit node, wherein the linear inductor is a conductive stripline, and the conductive stripline is a superconducting material formed as a straight line, and
    wherein operating the superconducting quantum processing circuit comprises applying, to the circuit loop of the tunable qubit device, a magnetic flux that controls a qubit frequency of the tunable qubit device.

13. The method of claim 12, wherein the superconducting quantum processing circuit comprises a flux bias device associated with the tunable qubit device, and applying the magnetic flux to the circuit loop comprises generating the magnetic flux by operation of the flux bias device.

14. The method of claim 13, wherein generating the magnetic flux by operation of the flux bias device comprises:
    generating a flux bias control signal by operation of a control system; and
    delivering the flux bias control signal to the flux bias device.

15. The method of claim 14, wherein the superconducting quantum processing circuit comprises a flux bias control line communicably coupled to the flux bias device, and delivering the flux bias control signal to the flux bias device comprises:
    delivering the flux bias control signal to the flux bias device via the flux bias control line.

16. The method of claim 14, wherein operating the superconducting quantum processing circuit comprises applying a qubit drive signal to the tunable qubit device.

17. The method of claim 16, wherein the superconducting quantum processing circuit comprises a qubit drive line, and applying the qubit drive signal to the tunable qubit device comprises:
    delivering the qubit drive signal to the tunable qubit device via the qubit drive line.

18. The method of claim 16, wherein the flux bias control signal is configured to tune the magnetic flux applied to the tunable qubit device between a parking value and a gate-activating value.

19. The method of claim 18, wherein operating the superconducting quantum processing circuit comprises activating a single-qubit quantum logic gate on the tunable qubit device by:
    applying the qubit drive signal at a qubit drive frequency; and
    tuning the magnetic flux to the gate-activating value.

20. The method of claim 12, wherein operating the superconducting quantum processing circuit comprises applying a quantum logic gate to a qubit defined by the tunable qubit device, and applying the quantum logic gate comprises applying the magnetic flux to the circuit loop.

21. A quantum computing system comprising:
    a superconducting quantum processing circuit comprising:
        a tunable qubit device, wherein the tunable qubit device is a tunable-frequency transmon qubit device comprising a circuit loop configured to receive, during operation of the tunable qubit device, a magnetic flux that controls a qubit frequency of the tunable qubit device, the circuit loop consisting of:
            a single non-linear circuit element, the single non-linear circuit element being a Josephson junction connected between a first circuit node and a second circuit node; and
            one or more linear circuit elements, the one or more linear circuit elements comprising a linear inductor connected in parallel with the Josephson junction between the first circuit node and the second circuit node, wherein the linear inductor is a conductive stripline, and the conductive stripline is a superconducting material formed as a straight line; and
    a control system configured to operate the superconducting quantum processing circuit.

* * * * *